(12) United States Patent
Ohshima

(10) Patent No.: US 8,861,288 B2
(45) Date of Patent: Oct. 14, 2014

(54) LEVEL-SHIFT CIRCUIT AND SEMICONDUCTOR INTEGRATED CIRCUIT

(71) Applicant: Semiconductor Energy Laboratory Co., Ltd., Atsugi (JP)

(72) Inventor: Kazuaki Ohshima, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 47 days.

(21) Appl. No.: 13/713,540

(22) Filed: Dec. 13, 2012

(65) Prior Publication Data

US 2013/0163350 A1 Jun. 27, 2013

(30) Foreign Application Priority Data

Dec. 23, 2011 (JP) ................................. 2011-282510

(51) Int. Cl.

| | | |
|---|---|---|
| *G11C 7/00* | (2006.01) | |
| *G11C 7/12* | (2006.01) | |
| *G11C 5/14* | (2006.01) | |
| *H03L 5/00* | (2006.01) | |
| *H03K 19/0185* | (2006.01) | |
| *G11C 7/10* | (2006.01) | |
| *G11C 11/4074* | (2006.01) | |
| *G11C 8/08* | (2006.01) | |

(52) U.S. Cl.
CPC .............. *H03L 5/00* (2013.01); *G11C 11/4074* (2013.01); *G11C 7/00* (2013.01); *H03K 19/018521* (2013.01); *G11C 7/1057* (2013.01); *G11C 7/1084* (2013.01); *G11C 7/12* (2013.01); *G11C 8/08* (2013.01)
USPC .................................................... 365/189.11

(58) Field of Classification Search
CPC ......... G11C 7/12; G11C 8/08; G11C 11/4074
USPC ....................................................... 365/189.11
See application file for complete search history.

(56) References Cited

U.S. PATENT DOCUMENTS

| | | |
|---|---|---|
| 4,578,600 A | 3/1986 | Magee |
| 4,833,350 A | 5/1989 | Frisch |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Ly D Pham
(74) *Attorney, Agent, or Firm* — Fish & Richardson P.C.

(57) ABSTRACT

A level-shift circuit with simpler circuit structure is provided. The level-shift circuit includes a first transistor in which a first power source potential is applied to a source electrode and a first gate electrode and a second power source potential is applied to a second gate electrode, and an inverter circuit to which a first input signal is applied and either a third power source potential or a potential obtained by subtracting an amount of change in the threshold voltage of the first transistor from the first power source potential is supplied as a power source voltage and from which a first output signal is output. A channel formation region of the first transistor is formed in an oxide semiconductor film.

20 Claims, 14 Drawing Sheets

(56) References Cited

U.S. PATENT DOCUMENTS

| | | |
|---|---|---|
| 5,039,893 A | 8/1991 | Tomisawa |
| 5,198,699 A | 3/1993 | Hashimoto et al. |
| 5,276,365 A | 1/1994 | Maekawa |
| 5,444,401 A | 8/1995 | Crafts |
| 5,568,084 A | 10/1996 | McClure et al. |
| 5,581,209 A | 12/1996 | McClure |
| 5,598,106 A | 1/1997 | Kawasaki et al. |
| 5,640,122 A | 6/1997 | McClure |
| 5,654,663 A | 8/1997 | McClure et al. |
| 5,731,856 A | 3/1998 | Kim et al. |
| 5,744,864 A | 4/1998 | Cillessen et al. |
| 5,793,247 A | 8/1998 | McClure |
| 5,939,937 A | 8/1999 | Terletzki |
| 6,294,274 B1 | 9/2001 | Kawazoe et al. |
| 6,563,174 B2 | 5/2003 | Kawasaki et al. |
| 6,646,486 B2 | 11/2003 | Uchiki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2003/0222684 A1 | 12/2003 | Tanishima |
| 2004/0038446 A1 | 2/2004 | Takeda et al. |
| 2004/0080972 A1 | 4/2004 | Seshadri et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0206324 A1 | 9/2005 | Tanishima |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0176176 A1 | 8/2007 | Yamazaki et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0252363 A1 | 10/2008 | Osame et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0063014 A1 | 3/2011 | Koyama et al. |
| 2011/0101942 A1 | 5/2011 | Yamazaki et al. |
| 2011/0242070 A1 | 10/2011 | Yamazaki et al. |
| 2012/0294096 A1 | 11/2012 | Nishijima |

FOREIGN PATENT DOCUMENTS

| | | |
|---|---|---|
| JP | 58-064828 A | 4/1983 |
| JP | 58-162130 A | 9/1983 |
| JP | 60-198861 A | 10/1985 |
| JP | 62-125713 A | 6/1987 |
| JP | 62-190923 A | 8/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-119427 A | 5/1990 |
| JP | 05-251705 A | 9/1993 |
| JP | 07-022939 A | 1/1995 |
| JP | 08-107345 A | 4/1996 |
| JP | 08-264794 A | 10/1996 |
| JP | 11-505377 A | 5/1999 |
| JP | 2000-040366 A | 2/2000 |
| JP | 2000-044236 A | 2/2000 |
| JP | 2000-150900 A | 5/2000 |
| JP | 2001-024501 A | 1/2001 |
| JP | 2001-077684 A | 3/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-159197 A | 6/2004 |
| JP | 2004-273614 A | 9/2004 |
| JP | 2004-273732 A | 9/2004 |
| WO | 2004/114391 A1 | 12/2004 |

(56) References Cited

FOREIGN PATENT DOCUMENTS

OTHER PUBLICATIONS

Orita, M et al., "Amorphous transparent conductive oxide InGaO3(ZnO)m (m>4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol—Gel—Derived Zinc Oxide Films by Irradiation With Ultraviolet Lamp," Journal of Sol—Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

(56) References Cited

OTHER PUBLICATIONS

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

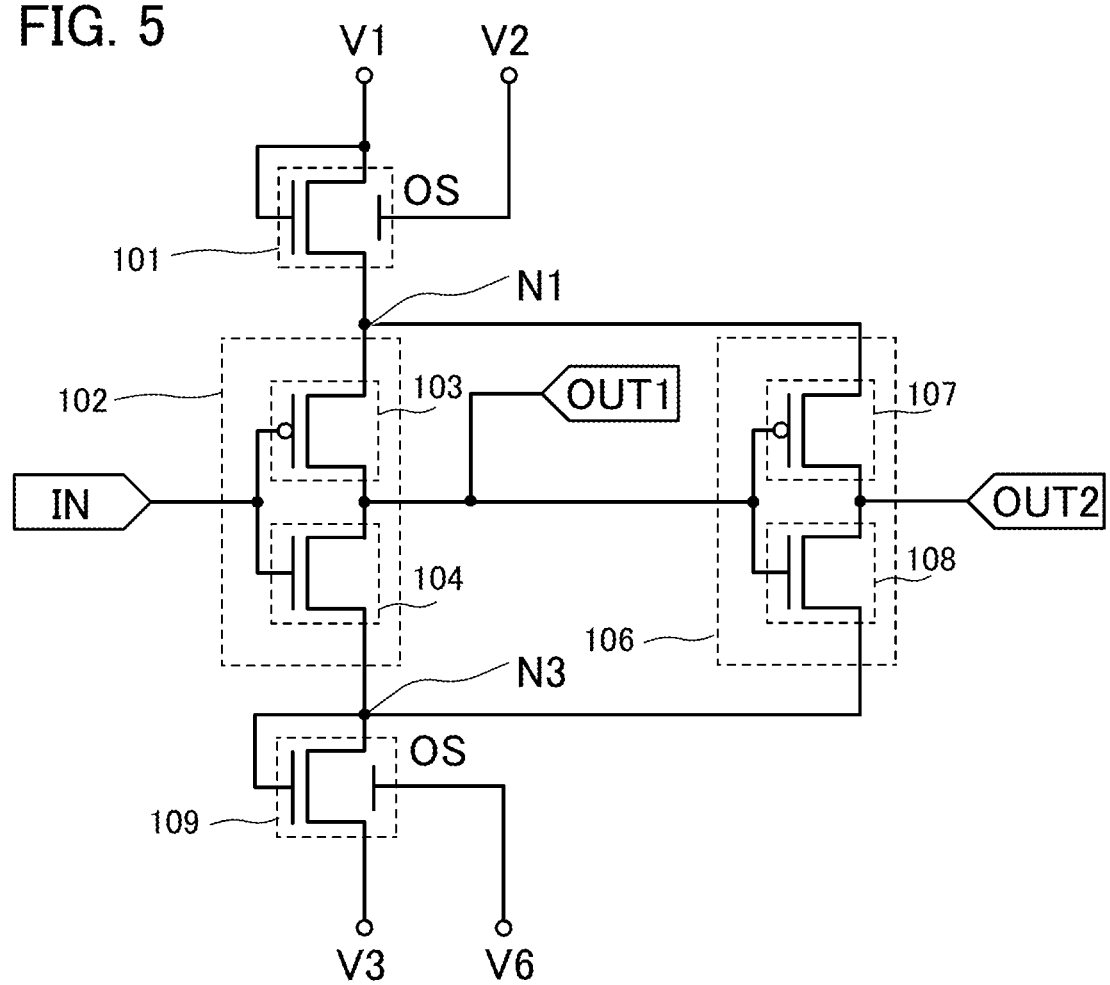

LEVEL-SHIFT CIRCUIT AND SEMICONDUCTOR INTEGRATED CIRCUIT

BACKGROUND OF THE INVENTION

1. Field of the Invention

The present invention relates to a level-shift circuit using transistors. Further, the present invention relates to a driving method thereof.

2. Description of the Related Art

In recent years, development of a semiconductor integrated circuit such as an LSI where circuits having a plurality of functions such as a CPU (central processing unit) and a memory are incorporated in one chip has been promoted. Reduction in voltage of a power source of the integrated circuit has been demanded for a reduction in power consumption. When signals are transferred between circuits which have different power source voltages and functions, level conversion of the signals need to be performed.

As one method for the level conversion, a level-shift circuit is disclosed in Patent Document 1, in which a gate and a drain of an N-ch MOS transistor are together connected to a power source voltage VDD and a source of the N-ch MOS transistor is connected to a power-source-side circuit terminal of a CMOS inverter circuit. According to the description in Patent Document 1, the level-shift circuit is configured to control the threshold voltage of the N-ch MOS transistor by connecting a P-Well corresponding to a back-gate of the N-ch MOS transistor to GND to output an output pulse of the level shift circuit, whose "H" level is lower than the power source voltage VDD by a value close to the threshold voltage of the MOS transistor in its waveform.

REFERENCE

Patent Document 1: Japanese Published Patent Application No. 2001-77684

SUMMARY OF THE INVENTION

However, it is not easy to control the voltage of an output terminal with high accuracy by such a method for the level conversion by control of the threshold voltage of a transistor which is connected to an inverter. This is because the voltage of the output terminal varies depending on variations in the threshold voltages of transistors.

Further, in the case of transferring signals between circuits which have different power source voltages and functions, with a plurality of such level-shift circuits, the threshold voltages of the transistors connected to their respective inverters need to be controlled each individually in order to output different voltages from the plurality of level-shift circuits.

From this point of view, it is considered to be necessary in the level-shift circuit described in Patent Document 1 to change a substrate voltage to change the threshold voltage of the transistor. Changing the substrate voltage is accompanied by a change of the threshold voltage of a transistor(s) of another circuit; therefore, it is difficult to control the threshold voltage of the plurality of transistors each individually. Further, to control the threshold voltage of the plurality of transistors each individually, a circuit is further necessary, which leads to an increase in circuit size.

Further, in the case where the plurality of level-shift circuits is manufactured using a silicon wafer, the L length or the amount of channel doping of transistors connected to the inverters needs to be changed each individually in order to change the threshold voltages of the transistors each individually, which complicates circuit design.

In view of the above-described problems, an object of one embodiment of the present invention is to provide a miniaturized level-shift circuit. Further, an object of one embodiment of the present invention is to provide a level-shift circuit in which output signals whose amplitudes are different from each other can be output from a plurality of output terminals. Further, an object of one embodiment of the present invention is to provide a semiconductor integrated circuit using the level-shift circuit, whose size is smaller and whose power consumption is less.

One embodiment of the present invention is a level-shift circuit including a first input terminal to which a first power source potential is applied, a second input terminal to which a second power source potential is applied, a third input terminal to which a third power source potential is applied, a fourth input terminal to which a first input signal is applied, a first output terminal from which a signal is output, an n-channel first transistor, and an inverter circuit including a p-channel second transistor and an n-channel third transistor.

In the n-channel first transistor, a channel formation region is formed in an oxide semiconductor film, and a pair of gate electrodes is provided to interpose the oxide semiconductor film therebetween. It is preferable that one of the gate electrodes overlap with the oxide semiconductor film with a first gate insulating film provided therebetween, and the other of the gate electrodes overlap with the oxide semiconductor film with a second gate insulating film provided therebetween. The one of the gate electrodes is a first gate electrode of the first transistor, and the other of the gate electrodes is a second gate electrode (also referred to as back-gate) of the first transistor. The threshold voltage of the first transistor is controlled by the level of the potential of the second gate electrode, more specifically by the potential difference between a source electrode of the first transistor and the second gate electrode. The amount of change in the threshold voltage, $\Delta V_{th}$ of the first transistor can be controlled by the second power source potential applied to the second gate electrode of the first transistor.

In this specification and the like, the "amount of change in the threshold voltage" of the transistor refers to the amount of change in the threshold value between before and after a potential is applied to the second gate electrode of the transistor.

Further, channel formation regions of the p-channel second transistor and the n-channel third transistor are formed in a semiconductor film of silicon or the like. As the semiconductor film, a single crystal semiconductor film or a polycrystalline semiconductor film of silicon, silicon carbide, or the like, or a compound semiconductor film of silicon germanium, gallium arsenide, indium phosphide, or the like can be used.

A gate electrode of the second transistor and a gate electrode of the third transistor are connected to the fourth input terminal, and a drain electrode of the second transistor and a source electrode of the third transistor are connected to the first output terminal. A drain electrode of the third transistor is connected to the third input terminal.

The source electrode and the first gate electrode of the first transistor are connected to the first input terminal, the second gate electrode of the first transistor is connected to the second input terminal, and a drain electrode of the first transistor is connected to a source electrode of the second transistor.

Accordingly, in the level-shift circuit of one embodiment of the present invention, when the input signal changes from a low level to a high level, the third power source potential is output from the first output terminal of the inverter circuit.

Further, when the input signal changes from the high level to the low level, a potential which is obtained by subtracting an amount of change in the threshold voltage of the first transistor from the first power source potential is output from the first output terminal of the inverter circuit. The threshold voltage of the first transistor can be controlled by the second power source potential applied to the second gate electrode of the first transistor.

By controlling the threshold voltage of the first transistor using the oxide semiconductor film by the potential applied to the second gate electrode of the first transistor, the potential output from the inverter circuit can be easily controlled.

Further, also in the case where the plurality of level-shift circuits each having the above-described structure is used, each threshold voltage of transistors using the oxide semiconductor film in the level-shift circuits can be changed individually. Accordingly, different potentials (or signals) can be output from the level-shift circuits.

One embodiment of the present invention is a level-shift circuit including a first input terminal to which a first power source potential is applied, a second input terminal to which a second power source potential is applied, a third input terminal to which a third power source potential is applied, a fourth input terminal to which a first input signal is applied, a first output terminal from which a first output signal is output, a first transistor in which the first power source potential is applied to a source electrode and a first gate electrode and the second power source potential is applied to a second gate electrode, and an inverter circuit to which the first input signal is applied and either the third power source potential or a potential obtained by subtracting an amount of change in the threshold voltage of the first transistor from the first power source potential is supplied as a power source voltage and from which the first output signal is output. A channel formation region of the first transistor is formed in an oxide semiconductor film.

Further, one embodiment of the present invention is a level-shift circuit including a first input terminal to which a first power source potential is applied, a second input terminal to which a second power source potential is applied, a third input terminal to which a third power source potential is applied, a fourth input terminal to which a first input signal is applied, a first output terminal from which a first output signal is output, a second output terminal from which a second output signal is output, a first transistor in which the first power source potential is applied to a source electrode and a first gate electrode and the second power source potential is applied to a second gate electrode, a first inverter circuit to which the first input signal is applied and either the third power source potential or a potential obtained by subtracting an amount of change in the threshold voltage of the first transistor from the first power source potential is supplied as a power source voltage and from which the first output signal is output, and a second inverter circuit to which the first output signal output from the first inverter circuit is input and either the third power source potential or the potential obtained by subtracting the amount of change in the threshold voltage of the first transistor from the first power source potential is supplied as a power source voltage and from which the second output signal is output. A channel formation region of the first transistor is formed in an oxide semiconductor film.

Still further, one embodiment of the present invention is a level-shift circuit including a first input terminal to which a first power source potential is applied, a second input terminal to which a second power source potential is applied, a third input terminal to which a third power source potential is applied, a fourth input terminal to which a fourth power source potential is applied, a fifth input terminal to which a first input signal is applied, a first output terminal from which a first output signal is output, a second output terminal from which a second output signal is output, a first transistor in which the first power source potential is applied to a source electrode and a first gate electrode and the second power source potential is applied to a second gate electrode, a second transistor in which the third power source potential is supplied to a source electrode and the fourth power source potential is supplied to a second gate electrode, a first inverter circuit to which the first input signal is applied and either a potential obtained by subtracting an amount of change in the threshold voltage of the first transistor from the first power source potential or a potential obtained by adding an amount of change in the threshold voltage of the second transistor to the third power source potential is supplied as a power source voltage and from which the first output signal is output, and a second inverter circuit to which the first output signal output from the first inverter circuit is input and either the potential obtained by subtracting the amount of change in the threshold voltage of the first transistor from the first power source potential or the potential obtained by adding the amount of change in the threshold voltage of the second transistor to the third power source potential is supplied as a power source voltage and from which the second output signal is output. A channel formation region of each of the first transistor and the second transistor is formed in an oxide semiconductor film.

In each of the above-described structures, the second inverter circuit includes a p-channel third transistor and an n-channel fourth transistor. A channel formation region is formed in a silicon film in each of the third transistor and the fourth transistor.

Further, in each of the above-described structures, the first inverter circuit includes a p-channel fifth transistor and an n-channel sixth transistor. A channel formation region is formed in a silicon film in each of the fifth transistor and the sixth transistor.

Further, the level-shift circuit having any of the above-described structures and a memory cell array including a plurality of memory cells each including a seventh transistor and a capacitor can constitute a semiconductor integrated circuit. Like the first and second transistors, a channel formation region of the seventh transistor is formed in an oxide semiconductor film.

According to one embodiment of the present invention, a miniaturized level-shift circuit can be provided. Further, a level-shift circuit which can output output signals having different amplitudes from a plurality of output terminals can be provided. Further, a semiconductor integrated circuit with smaller size and less power consumption, which uses the level-shift circuit, can be provided.

BRIEF DESCRIPTION OF THE DRAWINGS

In the accompanying drawings:

FIG. 5 illustrates a level-shift circuit of one embodiment of the present invention;

DETAILED DESCRIPTION OF THE INVENTION

Figure 1A:
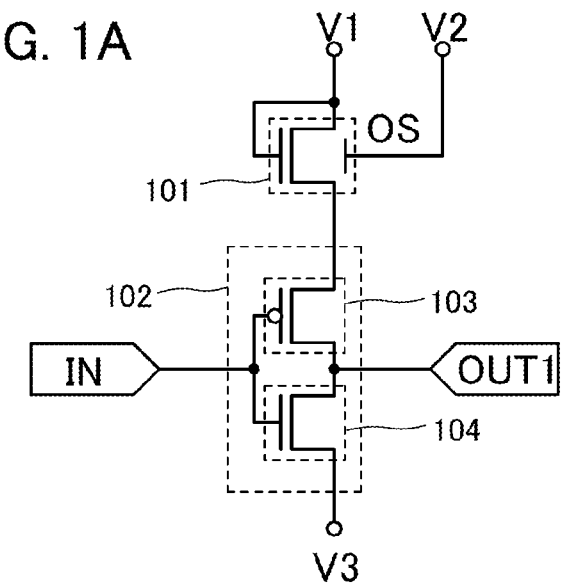
FIGS. 1A to 1C illustrate level-shift circuits of one embodiment of the present invention.

Examples of embodiments of the present invention are described with reference to the drawings in detail. In the structures described below, the same portions or portions having similar functions are denoted by the same reference numerals throughout the drawings, and description thereof is not necessarily repeated.

The position, size, range, or the like of each component illustrated in the drawings and the like is not necessarily an accurate position, an accurate size, an accurate range, or the like for easy understanding. Therefore, embodiments of the disclosed invention are not necessarily limited to the position, size, range, or the like as disclosed in the drawings and the like.

In addition, in this specification and the like, ordinal numbers such as "first", "second", and "third" are used in order to avoid confusion among components, and do not connote numeral limitation.

In this specification and the like, the "voltage" and the "potential" are synonymous with each other in some cases.

Functions of the "source" and the "drain" are switched to each other depending on the conductivity type of the transistor, the current direction which is changed in circuit operation, and the like. Therefore, the terms "source" and "drain" can be replaced with each other in this specification.

Further, in this specification and the like, being "electrically connected" encompasses connection via anything having an electrical action. There is no particular limitation on the anything having an electrical action as long as it enables transmission and receiving of electric signals between components to be connected to each other.

(Embodiment 1)

In this embodiment, a level-shift circuit of one embodiment of the present invention is described with reference to FIGS. 1A to 1C and FIGS. 2 to 5. In each circuit diagram, "OS" written beside a transistor denotes that the transistor uses an oxide semiconductor.

<Level-Shift Circuit Configuration 1>

FIG. 1A is a diagram showing a configuration example of a level-shift circuit of one embodiment of the present invention. A level-shift circuit shown in FIG. 1A includes a first input terminal to which a first power source potential V1 is applied, a second input terminal to which a second power source potential V2 is applied, a third input terminal to which a third power source potential V3 is applied, a fourth input terminal to which an input signal IN is applied, a first output terminal from which a first output signal OUT1 is output, an n-channel transistor 101, and an inverter circuit 102. The inverter circuit 102 includes a p-channel transistor 103 and an n-channel transistor 104.

In the n-channel transistor 101, a channel formation region is formed in an oxide semiconductor film, and a pair of gate electrodes is provided to interpose the oxide semiconductor film therebetween. It is preferable that one of the gate electrodes overlap with the oxide semiconductor film with a first gate insulating film provided therebetween, and the other of the gate electrodes overlap with the oxide semiconductor film with a second gate insulating film provided therebetween. The one of the gate electrodes is a first gate electrode of the transistor 101, and the other of the gate electrodes is a second gate electrode (also referred to as back-gate) of the transistor 101. The threshold voltage of the transistor 101 is controlled by the level of the potential of the second gate electrode, more specifically by the potential difference between a source electrode of the transistor 101 and the second gate electrode. The amount of change in the threshold voltage of the transistor 101, $\Delta V_{th101}$ can be controlled by the second power source potential V2 applied to the second gate electrode of the transistor 101.

In each of the p-channel transistor 103 and the n-channel transistor 104, a channel formation region is formed in a semiconductor film of silicon or the like. As the semiconductor film, a single crystal semiconductor film or a polycrystalline semiconductor film of silicon, silicon carbide, or the like, or a compound semiconductor film of silicon germanium, gallium arsenide, indium phosphide, or the like can be used.

A gate electrode of the transistor 103 and a gate electrode of the transistor 104 are connected to the fourth input terminal, and a drain electrode of the transistor 103 and a source electrode of the transistor 104 are connected to the first output terminal. A drain electrode of the transistor 104 is connected to the third input terminal.

As to the transistor 101, the source electrode and the first gate electrode are connected to the first input terminal, the second gate electrode is connected to the second input terminal, and a drain electrode is connected to a source electrode of the transistor 103.

The transistor 101, which can be formed using an oxide semiconductor film, can be stacked over the transistor 103 and the transistor 104. Accordingly, the transistors constituting the level-shift circuit can partly have a stack structure, leading to a reduction in the area of the level-shift circuit. Any transistor using an oxide semiconductor film described in this embodiment can be stacked over a transistor using a semiconductor film of silicon or the like.

Next, an operation of the level-shift circuit shown in FIG. 1A is described, where the first power source potential V1 is VDD, the second power source potential V2 is VSS, the third power source potential V3 is GND (ground potential), the input signal IN at a low level is GND, the input signal IN at a high level is VDD, and the amount of change in the threshold voltage of the transistor 101 is $\Delta V_{th101}$.

In the level-shift circuit shown in FIG. 1A, when the input signal IN changes from the low level to the high level, the first output signal OUT1 at a low level (third power source potential V3) is output from the first output terminal of the inverter circuit 102.

When the input signal IN changes from the high level to the low level, the first output signal OUT1 at a high level (a potential obtained by subtracting the amount of change in the threshold voltage of the transistor 101, $\Delta V_{th101}$ from the first power source potential V1) is output from the first output terminal of the inverter circuit 102.

In this manner, the threshold voltage of the transistor 101 is changed by the potential applied to the second gate electrode, whereby the output signal OUT1 at the time when the input signal IN is at the low level can be easily controlled.

Figure 1B:
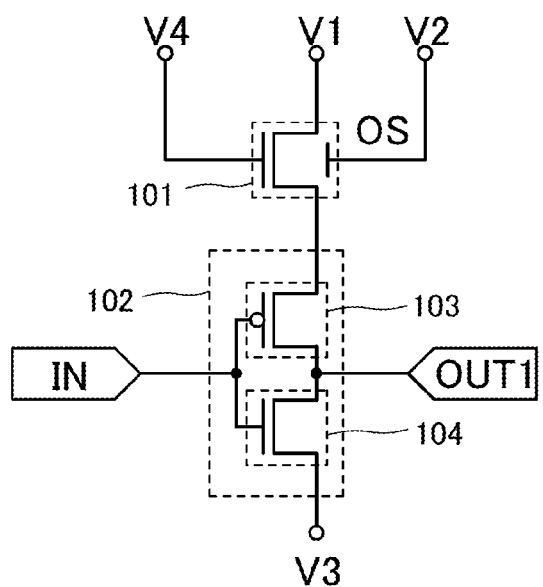

A level-shift circuit shown in FIG. 1B is configured such that the first gate electrode of the transistor 101 in the level-shift circuit shown in FIG. 1A is connected to a fifth input terminal to which a fourth power source potential V4 is applied. The fourth power source potential V4 is, for example, VDD.

In the level-shift circuit shown in FIG. 1A, the first gate electrode of the transistor 101 is connected to the first input terminal and thus controlled by the first power source potential V1. On the other hand, in the level-shift circuit shown in FIG. 1B, the first gate electrode of the transistor 101 can be controlled by the fourth power source potential. The first gate electrode of the transistor 101 and the second gate electrode of the transistor 101 are each individually controlled, whereby the output signal OUT1 at the time when the input signal IN is at the low level can be easily controlled. Further, in the level-shift circuit shown in FIG. 1B, a high-level potential (e.g., VDD) or a low-level potential (e.g., GND) is applied to the first gate electrode of the transistor 101, whereby on/off of the transistor 101 can be controlled. Further, a transistor using an oxide semiconductor can be used as the transistor 101, which enables the off-state current to be extremely small. Therefore, by turning off the transistor 101 when the input signal IN is at the high level, power consumption of the level-shift circuit can be reduced.

Figure 1C:
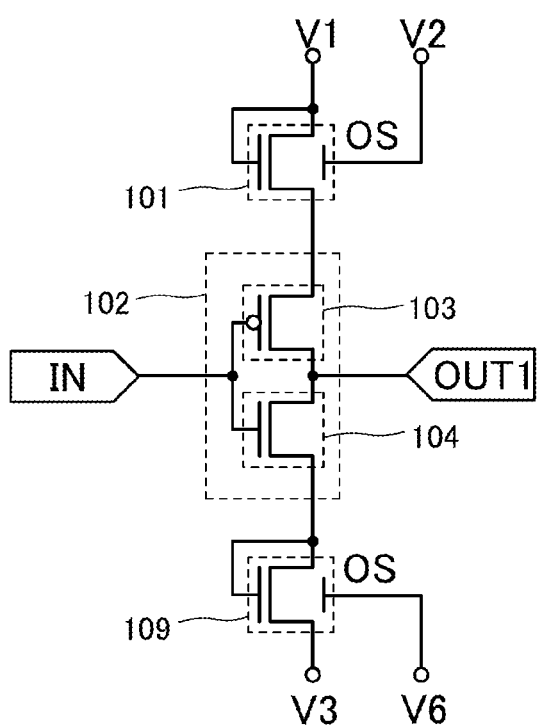

A level-shift circuit shown in FIG. 1C includes a seventh input terminal to which a sixth power source potential V6 is applied and an n-channel transistor 109 in addition to the configuration of the level-shift circuit shown in FIG. 1A.

In the n-channel transistor 109, like the n-channel transistor 101, a channel formation region is formed in an oxide semiconductor film, and a pair of gate electrodes is provided to interpose the oxide semiconductor film therebetween. One of the gate electrodes is a first gate electrode of the transistor 109, and the other of the gate electrodes is a second gate electrode (also referred to as back-gate) of the transistor 109. The threshold voltage of the transistor 109 is controlled by the level of the potential of the second gate electrode, more specifically by the potential difference between a source electrode of the transistor 109 and the second gate electrode.

As to the transistor 109, the source electrode is connected to the drain electrode of the transistor 104, the second gate electrode is connected to the seventh input terminal, and a drain electrode is connected to the third input terminal.

Next, an operation of the level-shift circuit shown in FIG. 1C is described, where the first power source potential V1 is VDD, the second power source potential V2 is VSS, the third power source potential V3 is GND (ground potential), the sixth power source potential V6 is VDD, the input signal IN at a low level is GND, the input signal IN at a high level is VDD, the amount of change in the threshold voltage of the transistor 101 is $\Delta V_{th101}$, and the amount of change in the threshold voltage of the transistor 109 is $\Delta V_{th109}$.

In the level-shift circuit shown in FIG. 1C, when the input signal IN changes from the low level to the high level, the first output signal OUT1 at a low level (a potential obtained by adding the amount of change in the threshold voltage of the transistor 109, $\Delta V_{th109}$ to the third power source potential V3) is output from the first output terminal of the inverter circuit 102.

When the input signal IN changes from the high level to the low level, the first output signal OUT1 at a high level (a potential obtained by subtracting the amount of change in the threshold voltage of the transistor 101, $\Delta V_{th101}$ from the first power source potential V1) is output from the first output terminal of the inverter circuit 102.

In this manner, in the level-shift circuit shown in FIG. 1C, the threshold voltage of the transistor 101 is changed by the potential applied to the second gate electrode of the transistor 101, and the threshold voltage of the transistor 109 is changed by the potential applied to the second gate electrode of the transistor 109, whereby an output signal whose amplitude is smaller (or whose potential at the time when the input signal IN is at the high level is higher) than that of any of output signals OUT1 of their respective level-shift circuits shown in FIGS. 1A and 1B can be output.

<Level-Shift Circuit Configuration 2>

Figure 2:
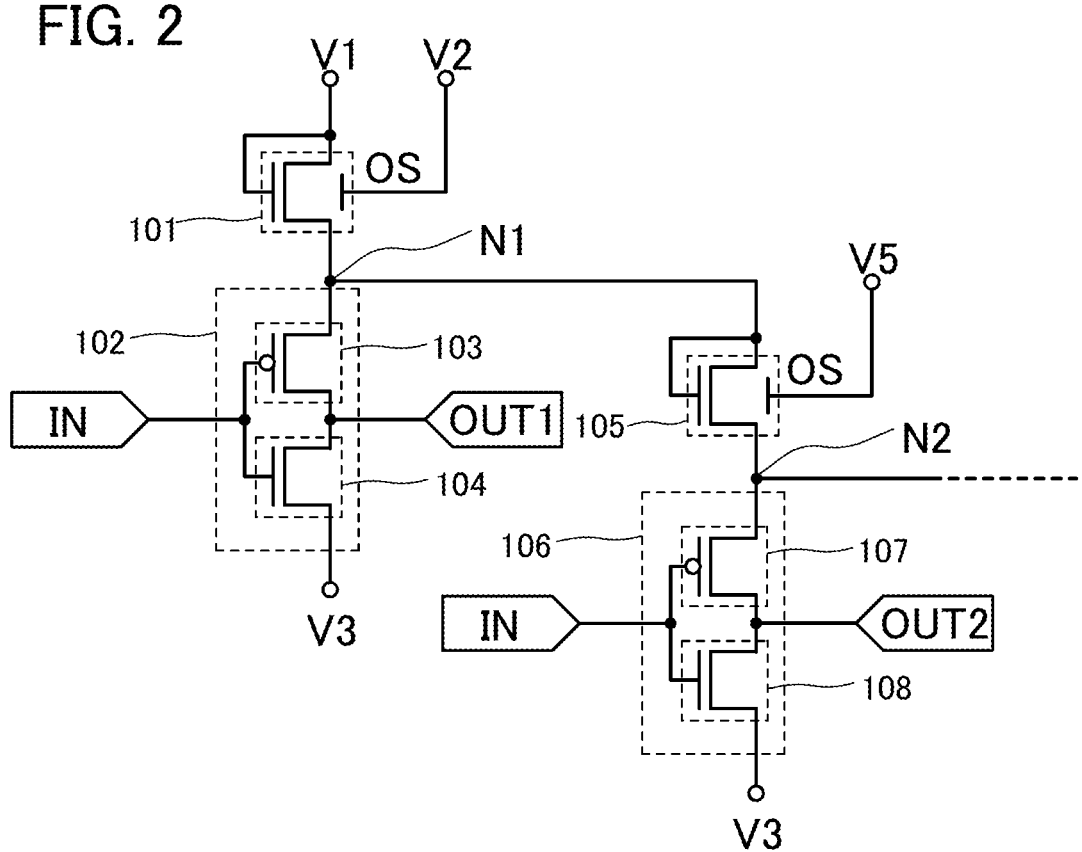
FIG. 2 illustrates a level-shift circuit of one embodiment of the present invention.

FIG. 2 is a diagram showing another configuration example of the level-shift circuit of one embodiment of the present invention. A level-shift circuit shown in FIG. 2 includes a sixth input terminal to which a fifth power source potential V5 is applied, a second output terminal from which a second output signal OUT2 is output, an n-channel transistor 105, and an inverter circuit 106 in addition to the configuration of the level-shift circuit shown in FIG. 1A. The inverter circuit 106 includes a p-channel transistor 107 and an n-channel transistor 108.

In the n-channel transistor 105, like the n-channel transistor 101, a channel formation region is formed in an oxide semiconductor film, and a pair of gate electrodes is provided to interpose the oxide semiconductor film therebetween. One of the gate electrodes is a first gate electrode of the transistor 105, and the other of the gate electrodes is a second gate electrode (also referred to as back-gate) of the transistor 105. The threshold voltage of the transistor 105 is controlled by the level of the potential of the second gate electrode, more specifically by the potential difference between a source electrode of the transistor 105 and the second gate electrode. The amount of change in the threshold voltage of the transistor 105, $\Delta V_{th105}$ can be controlled by the fifth power source potential V5 applied to the second gate electrode of the transistor 105.

In each of the p-channel transistor 107 and the n-channel transistor 108, a channel formation region is formed in a semiconductor film of silicon or the like. A gate electrode of the transistor 107 and a gate electrode of the transistor 108 are connected to the first input terminal, and a drain electrode of the transistor 107 and a source electrode of the transistor 108 are connected to the second output terminal. A drain electrode of the transistor 108 is connected to the third input terminal.

As to the transistor 105, the source electrode is connected to a node N1 to which a drain electrode of the transistor 101 and the source electrode of the transistor 103 are connected, the second gate electrode is connected to the sixth input terminal, and a drain electrode is connected to a source electrode of the transistor 107.

Next, an operation of the level-shift circuit shown in FIG. 2 is described, where the first power source potential V1 is VDD, the second power source potential V2 is VSS, the third power source potential V3 is GND (ground potential), the fifth power source potential V5 is VDD, the input signal IN at a low level is GND, the input signal IN at a high level is VDD, the amount of change in the threshold voltage of the transistor 101 is $\Delta V_{th101}$, and the amount of change in the threshold voltage of the transistor 105 is $\Delta V_{th105}$.

In the level-shift circuit shown in FIG. 2, when the input signal IN changes from the low level to the high level, a signal at a low level (the third power source potential V3) is output from the first output terminal of the inverter circuit 102, and the signal at the low level (third power source potential V3) is output from the second output terminal of the inverter circuit 106.

When the input signal IN changes from the high level to the low level, the first output signal OUT1 at a high level (a potential obtained by subtracting the amount of change in the threshold voltage of the transistor 101, $\Delta V_{th101}$ from the first power source potential V1) is output from the first output terminal of the inverter circuit 102. In addition, the second output signal OUT2 at a high level (a potential obtained by subtracting the amount of change in the threshold voltage of the transistor 105, $\Delta V_{th105}$ from the potential obtained by subtracting the amount of change in the threshold voltage of the transistor 101, $\Delta V_{th101}$ from the first power source potential V1) is output from the second output terminal of the inverter circuit 106.

In this manner, the threshold voltage of the transistor 101 is controlled by the second power source potential V2 applied to the second gate electrode of the transistor 101, and the threshold voltage of the transistor 105 is controlled by the fifth power source potential V5, whereby a signal whose amplitude is different from that of the signal output from the first output terminal can be output from the second output terminal. The potential output from the second output terminal is lower than the potential output from the first output terminal.

By controlling the potential of the first gate electrode of the transistor 101 and the potential of the second gate electrode of the transistor 101, the first output signal OUT1 of the inverter circuit 102 at the time when the input signal IN is at the low level can be easily controlled. Further, with the use of the potential of the node N1 obtained as a result of such control of the first gate electrode of the transistor 101 and the second gate electrode of the transistor 101, the potential of the first gate electrode of the transistor 105 and the potential of the second gate electrode of the transistor 105 are controlled, whereby the second output signal OUT2 of the inverter circuit 106 at the time when the input signal IN is at the low level can be easily controlled. The circuit configuration 2 enables a potential unattainable from the circuit configuration 1 to be output as the second output signal OUT2 of the inverter circuit 106.

In the level-shift circuit shown in FIG. 2, different signals are output from their two respective output terminals. However, embodiments of the present invention are not limited thereto; different signals may be output from three or more respective output terminals. For example, in the case where different signals are output from three respective output terminals, a source electrode of a transistor whose channel formation region is formed in an oxide semiconductor film may be connected to a node N2 shown in FIG. 2, and an inverter circuit may be connected to a drain electrode of the transistor. By controlling a power source potential applied to a second gate electrode of the transistor, an output signal whose amplitude is smaller (or whose potential at the time when the input signal IN is at the low level is lower) than that of the second output signal can be output as a third output signal from the inverter.

<Level-Shift Circuit Configuration 3>

Figure 3:
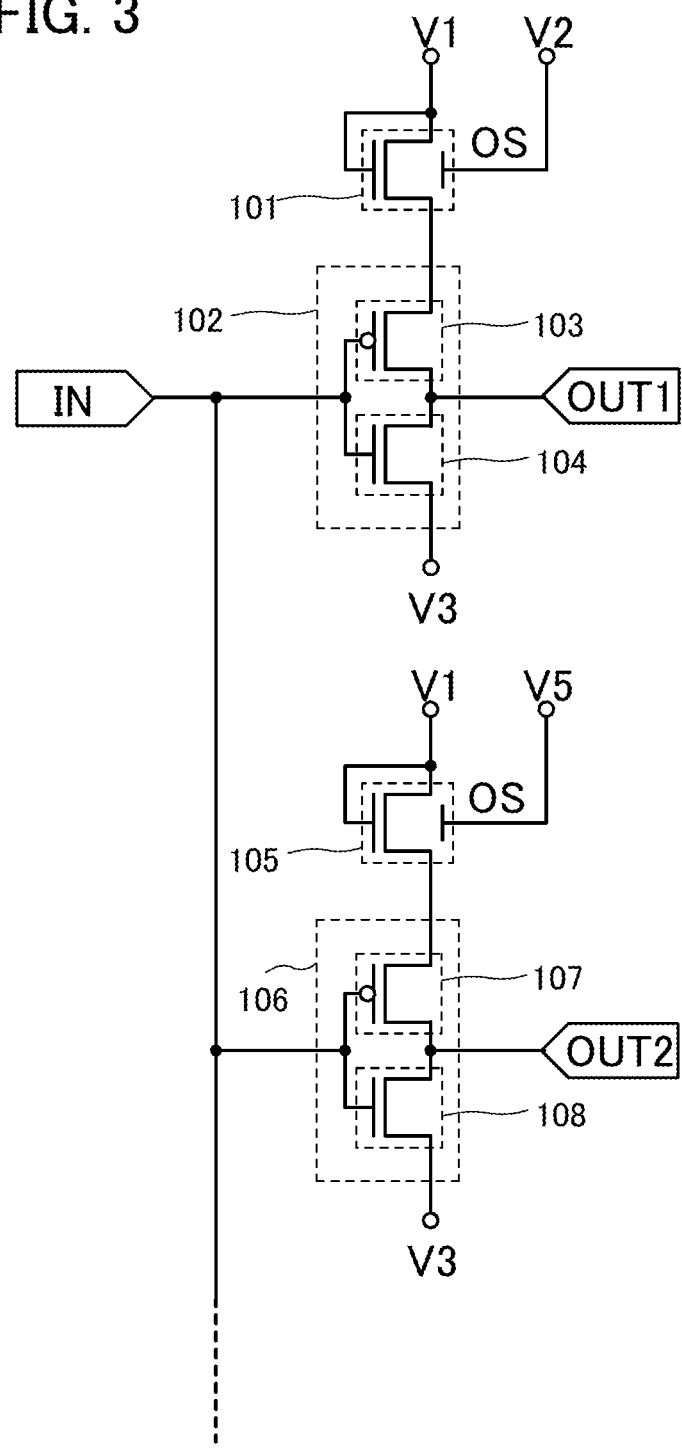
FIG. 3 illustrates a level-shift circuit of one embodiment of the present invention.

FIG. 3 is a diagram showing another configuration example of the level-shift circuit of one embodiment of the present invention. A connection of a level-shift circuit shown in FIG. 3 is different from that of the level-shift circuit shown in FIG. 2.

The source electrode of the transistor 105, which is connected to the node N1 in the level-shift circuit shown in FIG. 2, is connected to the first input terminal in the level-shift circuit shown in FIG. 3.

Next, an operation of the level-shift circuit shown in FIG. 3 is described, where the first power source potential V1 is VDD, the second power source potential V2 is VSS, the third power source potential V3 is GND (ground potential), the fifth power source potential VS is VDD, the input signal IN at a low level is GND, the input signal IN at a high level is VDD, the amount of change in the threshold voltage of the transistor 101 is $\Delta V_{th101}$, and the amount of change in the threshold voltage of the transistor 105 is $\Delta V_{th105}$.

In the level-shift circuit shown in FIG. 3, when the input signal IN changes from the low level to the high level, a signal at a low level (the third power source potential V3 (e.g., GND)) is output from the first output terminal of the inverter circuit 102, and the signal at the low level (third power source potential V3 (e.g., GND)) is output from the second output terminal of the inverter circuit 106.

When the input signal IN changes from the high level to the low level, the first output signal OUT1 at a high level (a potential obtained by subtracting the amount of change in the threshold voltage of the transistor 101, $\Delta V_{th101}$ from the first power source potential V1 (e.g., VDD)) is output from the first output terminal of the inverter circuit 102. In addition, the second output signal OUT2 at a low level (a potential obtained by subtracting the amount of change in the threshold voltage of the transistor 105, $\Delta V_{th105}$ from the first power source potential V1 (e.g., VDD)) is output from the second output terminal of the inverter circuit 106.

The first output terminal of the inverter circuit 102 and the second output terminal of the inverter circuit 106, which share the input signal IN, can be controlled individually, which enables different potentials to be output as respective outputs on the basis of the same logical operation. The amount of change in the threshold voltage of the transistor 101, $\Delta V_{th101}$ and the amount of change in the threshold voltage of the transistor 105, $\Delta V_{th105}$ can be controlled by the second power source potential V2 and the fifth power source potential V5, respectively. Accordingly, the second output signal OUT2 is either an output signal whose amplitude is larger (or whose potential at the time when the input signal IN is at the low level is higher) than that of the first output signal OUT1 or an output signal whose amplitude is smaller (or whose potential at the time when the input signal IN is at the low level is lower) than that of the first output signal OUT1.

In the level-shift circuit shown in FIG. 3, different signals are output from the two respective output terminals. However, embodiments of the present invention are not limited thereto; different signals may be output from three or more respective output terminals. For example, in the case where different signals are output from three respective output terminals, an inverter circuit may be connected to a fourth input terminal shown in FIG. 3, and a source electrode of a p-channel transistor in the inverter circuit may be connected to a drain electrode of a transistor whose channel formation region is formed in an oxide semiconductor film. By controlling a power source potential applied to a second gate electrode of the transistor, an output signal which is different from each of the first output signal and the second output signal can be output from a third output terminal of the inverter circuit. It is needless to say that output signals output from their respective output terminals may have the same amplitude (or the same potential at the time when the input signal IN is at the low level).

<Level-Shift Circuit Configuration 4>

Figure 4:
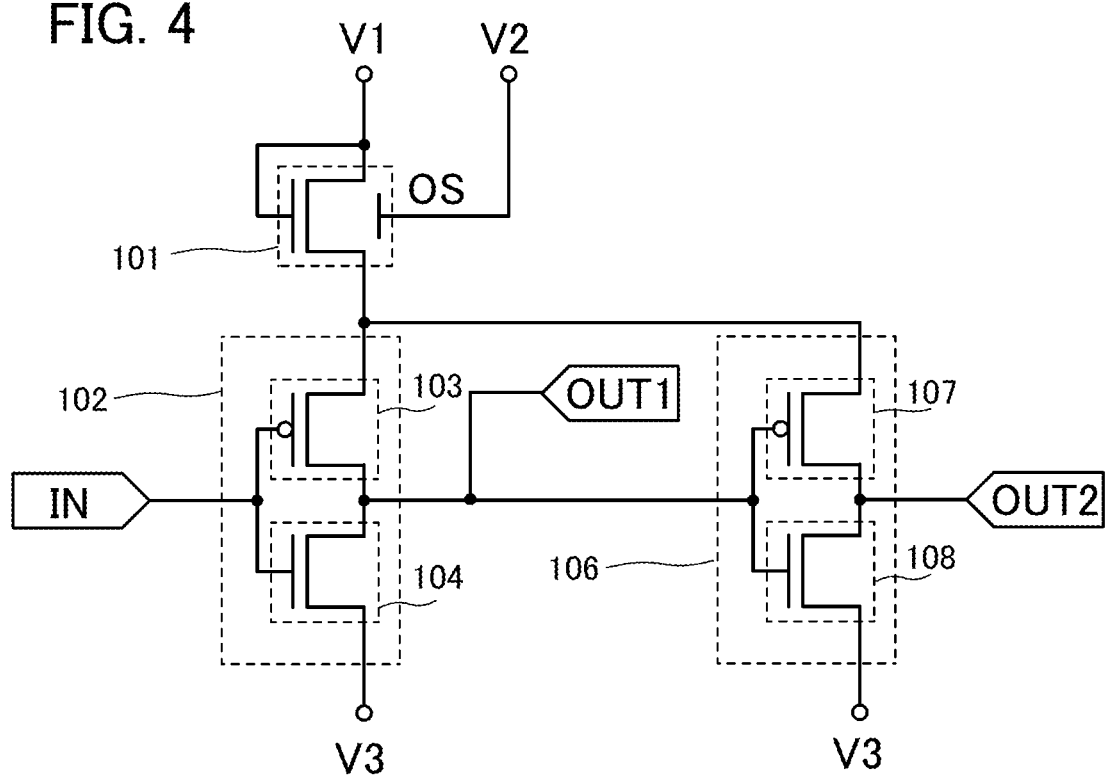
FIG. 4 illustrates a level-shift circuit of one embodiment of the present invention.

FIG. 4 is a diagram showing another configuration example of the level-shift circuit of one embodiment of the present invention. A level-shift circuit shown in FIG. 4 includes the second output terminal from which the second output signal OUT2 is output, and the inverter circuit 106 in addition to the configuration of the level-shift circuit shown in FIG. 1A. The inverter circuit 106 includes the p-channel transistor 107 and the n-channel transistor 108.

In each of the p-channel transistor 107 and the n-channel transistor 108, a channel formation region is formed in a semiconductor film of silicon or the like. The gate electrode of the transistor 107 and the gate electrode of the transistor 108 are connected to the first output terminal, and the drain electrode of the transistor 107 and the source electrode of the transistor 108 are connected to the second output terminal.

Next, an operation of the level-shift circuit shown in FIG. 4 is described, where the first power source potential V1 is VDD, the second power source potential V2 is VSS, the third power source potential V3 is GND (ground potential), the input signal IN at a low level is GND, the input signal IN at a high level is VDD, and the amount of change in the threshold voltage of the transistor 101 is $\Delta V_{th101}$.

In the level-shift circuit shown in FIG. 4, when the input signal IN changes from the low level to the high level, the first output signal OUT1 at a low level (third power source potential V3) is output from the first output terminal of the inverter circuit 102. Consequently, the third power source potential V3 is applied to the gate electrode of the transistor 107 and the gate electrode of the transistor 108, so that the second output signal OUT2 at a high level (a potential obtained by subtracting the amount of change in the threshold voltage of the transistor 101, $\Delta V_{th101}$ from the first power source potential V1) is output from the second output terminal of the inverter circuit 106.

When the input signal IN changes from the high level to the low level, the first output signal OUT1 at a high level (potential obtained by subtracting the amount of change in the threshold voltage of the transistor 101, $\Delta V_{th101}$ from the first power source potential V1) is output from the first output terminal of the inverter circuit 102. Consequently, the potential obtained by subtracting the amount of change in the threshold voltage of the transistor 101, $\Delta V_{th101}$ from the first power source potential V1 is applied to the gate electrode of the transistor 107 and the gate electrode of the transistor 108, so that the second output signal OUT2 at a low level (third power source potential V3) is output from the second output terminal of the inverter circuit 106.

The potential of the second output signal OUT2 at the high level in the inverter circuit 106 can be easily controlled by the potential obtained by subtracting the amount of change in the threshold voltage of the transistor 101, $\Delta V_{th101}$ from the first power source potential V1 (e.g., VDD).

<Level-Shift Circuit Configuration 5>

FIG. 5 is a diagram showing another configuration example of the level-shift circuit of one embodiment of the present invention. A level-shift circuit shown in FIG. 5 includes the seventh input terminal to which the sixth power source potential V6 is applied and the n-channel transistor 109 in addition to the configuration of the level-shift circuit shown in FIG. 4.

In the n-channel transistor 109, like the n-channel transistor 101, a channel formation region is formed in an oxide semiconductor film, and a pair of gate electrodes is provided to interpose the oxide semiconductor film therebetween. One of the gate electrodes is a first gate electrode of the transistor 109, and the other of the gate electrodes is a second gate electrode (also referred to as back-gate) of the transistor 109. The threshold voltage of the transistor 109 is controlled by the level of the potential of the second gate electrode, more specifically by the potential difference between a source electrode of the transistor 109 and the second gate electrode.

As to the transistor 109, the source electrode is connected to the drain electrode of the transistor 104, the second gate electrode is connected to the seventh input terminal, and the drain electrode is connected to the third input terminal.

The source electrode of the transistor 107 is connected to the node N1, and the drain electrode of the transistor 108 is connected to a node N3 to which the drain electrode of the transistor 104 and the source electrode of the transistor 109 are connected.

Next, an operation of the level-shift circuit shown in FIG. 5 is described, where the first power source potential V1 is VDD, the second power source potential V2 is VSS, the third power source potential V3 is GND (ground potential), the sixth power source potential V6 is VDD, the input signal IN at a low level is GND, the input signal IN at a high level is VDD, the amount of change in the threshold voltage of the transistor 101 is $\Delta V_{th101}$, and the amount of change in the threshold voltage of the transistor 109 is $\Delta V_{th109}$.

In the level-shift circuit shown in FIG. 5, when the input signal IN changes from the low level to the high level, the first output signal OUT1 at a low level (a potential obtained by adding the amount of change in the threshold voltage of the transistor 109, $\Delta V_{th109}$ to the third power source potential V3) is output from the first output terminal of the inverter circuit 102. Consequently, the potential obtained by adding the amount of change in the threshold voltage of the transistor 109, $\Delta V_{th109}$ to the third power source potential V3 is applied to the gate electrode of the transistor 107 and the gate electrode of the transistor 108, so that the second output signal OUT2 at a high level (a potential obtained by subtracting the amount of change in the threshold voltage of the transistor 101, $\Delta V_{th101}$ from the first power source potential V1) is output from the second output terminal of the inverter circuit 106.

When the input signal IN changes from the high level to the low level, the first output signal OUT1 at a high level (potential obtained by subtracting the amount of change in the threshold voltage of the transistor 101, $\Delta V_{th101}$ from the first power source potential V1) is output from the first output terminal of the inverter circuit 102. Consequently, the potential obtained by subtracting the amount of change in the threshold voltage of the transistor 101, $\Delta V_{th101}$ from the first power source potential V1 is applied to the gate electrode of the transistor 107 and the gate electrode of the transistor 108, so that the second output signal OUT2 at a low level (potential obtained by adding the amount of change in the threshold voltage of the transistor 109, $\Delta V_{th109}$ to the third power source potential V3) is output from the second output terminal of the inverter circuit 106.

Since the source electrode of the transistor 107 is connected to the node N1 and the drain electrode of the transistor 108 is connected to the node N3, the potential output from the second output terminal of the inverter circuit 106 can be easily controlled both at the time when the input signal IN is at the high level and at the time when the input signal IN is at the low level.

The structures, methods, and the like described in this embodiment can be combined as appropriate with any other structure, method, and the like described in the other embodiments.

(Embodiment 2)

In this embodiment, one example of the manufacturing method of the level-shift circuit described in Embodiment 1 is described using FIGS. 6A to 6E, FIGS. 7A to 7D, FIGS. 8A to 8C, and FIGS. 9A and 9B. First, a manufacturing method of a transistor in a lower portion of the level-shift circuit is described, and then, a manufacturing method of a transistor in an upper portion of the level-shift circuit is described.

In cross-sectional views illustrating a manufacturing process in FIGS. 6A to 6E, FIGS. 7A to 7D, FIGS. 8A to 8C, and FIGS. 9A and 9B, A1-A2 corresponds to a cross section illustrating a manufacturing process of a transistor 330 and B1-B2 corresponds to a cross section illustrating a manufacturing process of a transistor 410 over a transistor 340. The transistor 410, the transistor 330, and the transistor 340 described in this embodiment correspond to the transistor 101, the transistor 103, and the transistor 104 described in Embodiment 1.

<Method for Manufacturing Transistor in Lower Portion>

Figure 6A:
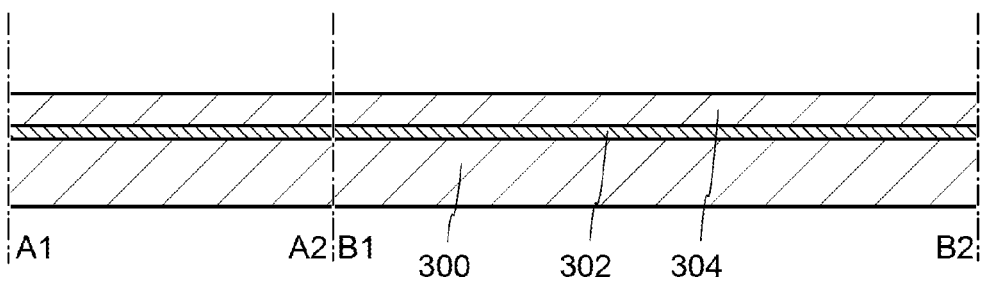
FIGS. 6A to 6E illustrate one example of a manufacturing process of a semiconductor device.

First, a substrate 300 over which a semiconductor film 304 is provided with an insulating film 302 provided therebetween is prepared (see FIG. 6A).

As the substrate 300, for example, a single crystal semiconductor substrate or a polycrystalline semiconductor substrate of silicon, silicon carbide, or the like, or a compound semiconductor substrate of silicon germanium, gallium arsenide, indium phosphide, or the like can be used. Further, a variety of glass substrates that are used in the electronics industry, such as substrates of aluminosilicate glass, aluminoborosilicate glass, and barium borosilicate glass, a quartz substrate, a ceramic substrate, and a sapphire substrate can also be used.

The insulating film 302 has a single-layer structure or a stacked-layer structure containing silicon oxide, silicon oxynitride, silicon nitride, or the like. As examples of the forming method of the insulating film 302, a thermal oxidation method, a CVD method, a sputtering method, and the like can be given. The thickness of the insulating film 302 is greater than or equal to 1 nm and less than or equal to 100 nm, preferably greater than or equal to 10 nm and less than or equal to 50 nm.

As the semiconductor film 304, a single crystal semiconductor film or a polycrystalline semiconductor film of silicon, silicon carbide, or the like, or a compound semiconductor film of silicon germanium, gallium arsenide, indium phosphide, or the like can be used. Since the semiconductor film 304 does not contain an oxide semiconductor material, the semiconductor film 304 is also referred to as a semiconductor material other than an oxide semiconductor.

It is preferable to use a single crystal semiconductor film of silicon or the like for the semiconductor film 304 because it enables the operation speed of the transistors 103 and 104 or the like to be fast.

Further, an SOI substrate can also be used as the substrate 300 over which the semiconductor film 304 is provided with the insulating film 302 provided therebetween. Although the "SOI substrate" generally means a substrate in which a silicon layer is provided on an insulating surface, the SOI substrate in this specification and the like also encompasses a substrate in which a semiconductor film of a material other than silicon is provided on an insulating surface. That is, the semiconductor film included in the "SOI substrate" is not limited to a silicon layer. Moreover, the SOI substrate also encompasses a structure in which a semiconductor film is provided over an insulating substrate such as a glass substrate with an insulating film provided therebetween. In this embodiment, the case is described in which an SOI substrate in which a silicon film is provided over a single crystal silicon substrate with a silicon oxide film provided therebetween is used as the substrate 300 over which the semiconductor film 304 is provided with the insulating film 302 provided therebetween.

Figure 6B:
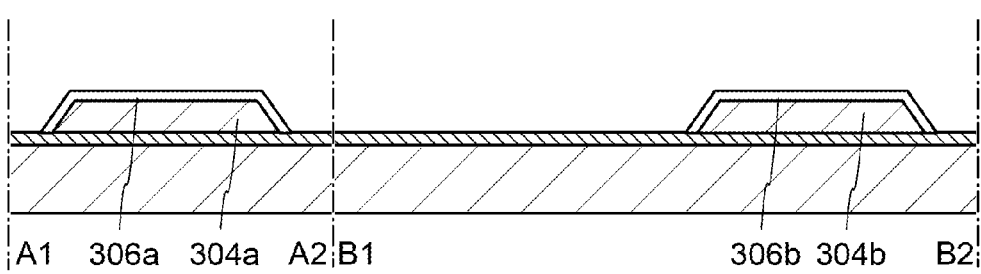

Next, the semiconductor film 304 is processed into an island shape to form semiconductor films 304a and 304b (see FIG. 6B). For the processing method, dry etching is preferably used, but wet etching may be used. The etching gas and the etchant can be selected as appropriate depending on a material of the layer to be etched.

Figure 6C:
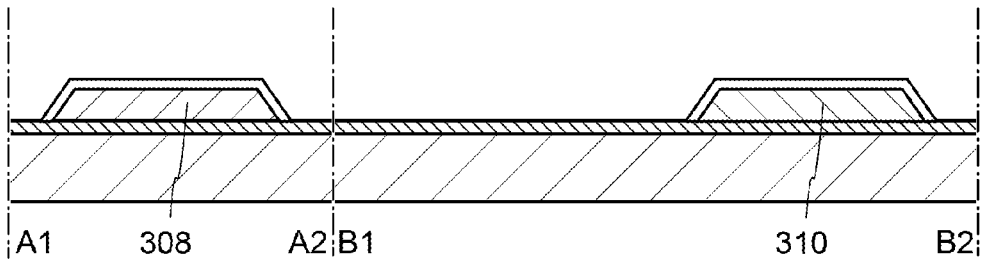

Next, gate insulating films 306a and 306b are formed so as to cover the semiconductor films 304a and 304b (see FIG. 6C). The gate insulating film 306a, 306b can be formed, for example, by heat treatment (e.g., thermal oxidation treatment or thermal nitridation treatment) on a surface of the semiconductor film 304a, 304b. High-density plasma treatment may be used instead of the heat treatment. The high-density plasma treatment can be performed using, for example, a mixed gas of a rare gas such as He, Ar, Kr, or Xe and any of oxygen, nitrogen oxide, ammonia, nitrogen, hydrogen, and the like. Needless to say, the gate insulating film may be formed by a CVD method, a sputtering method, or the like.

The gate insulating film 306a, 306b can be formed using silicon oxide, silicon oxynitride, silicon nitride, aluminum oxide, tantalum oxide, or the like. Alternatively, the gate insulating film can be formed using a material with a high dielectric constant (a high-k material) such as hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), or hafnium aluminate to which nitrogen is added ($HfAl_xO_yN_z$ (x>0, y>0, z>0)). The gate insulating film is formed to have a single-layer structure or a stacked-layer structure using any of the above materials. Further, the thickness of the gate insulating film 306a, 306b can be, for example, greater than or equal to 1 nm and less than or equal to 100 nm, preferably greater than or equal to 10 nm and less than or equal to 50 nm.

Such a small thickness of the gate insulating film as described above leads to a problem of gate leakage due to a tunnel effect or the like. To solve the problem of gate leakage, the above-described high-k material is preferably used for the gate insulating film. The use of a high-k material for the gate insulating film makes it possible to increase the thickness in order to suppress gate leakage while ensuring electric characteristics. A stacked-layer structure of a film containing a high-k material and a film containing any one of silicon oxide, silicon nitride, silicon oxynitride, silicon nitride oxide, aluminum oxide, and the like may be employed therefor.

In this embodiment, a silicon oxide film is formed by thermal oxidation treatment, whereby the gate insulating film 306a, 306b is formed.

Next, an impurity element imparting n-type conductivity and an impurity element imparting p-type conductivity are added to the semiconductor films 304a and 304b through the gate insulating films 306a and 306b in order to control the threshold voltages of the transistors (see FIG. 6C). In the case where silicon is used for the semiconductor film 304a, 304b, phosphorus, arsenic, or the like can be used as the impurity element imparting n-type conductivity. On the other hand, boron, aluminum, gallium, or the like can be used as the impurity element imparting p-type conductivity.

In this embodiment, boron is added to the semiconductor film 304a through the gate insulating film 306a, so that an impurity region 308 is formed, and phosphorus is added to the semiconductor film 304b through the gate insulating film 306b, so that an impurity region 310 is formed.

Figure 6D:
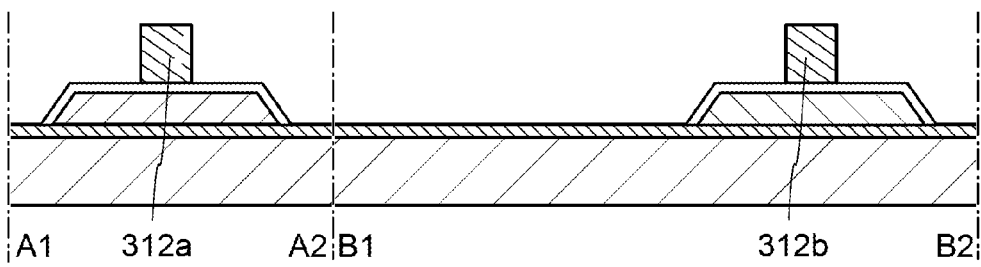

Next, a conductive film for forming a gate electrode (including a wiring formed in the same layer as the gate electrode) is formed over the gate insulating films 306a and 306b and is processed, so that gate electrodes 312a and 312b are formed (see FIG. 6D).

The conductive film used for the gate electrodes 312a and 312b can be formed using a metal material such as aluminum, copper, titanium, tantalum, or tungsten. Alternatively, a layer containing a conductive material may be formed using a semiconductor material such as polycrystalline silicon. There is no particular limitation on the method for forming the conductive film; a variety of film formation methods such as an evaporation method, a CVD method, a sputtering method, and a spin coating method can be used. The conductive film can be processed by etching using a resist mask. In this embodiment, a tantalum nitride film and a tungsten film are stacked by a sputtering method and processed, so that the gate electrodes 312a and 312b are formed.

Figure 6E:
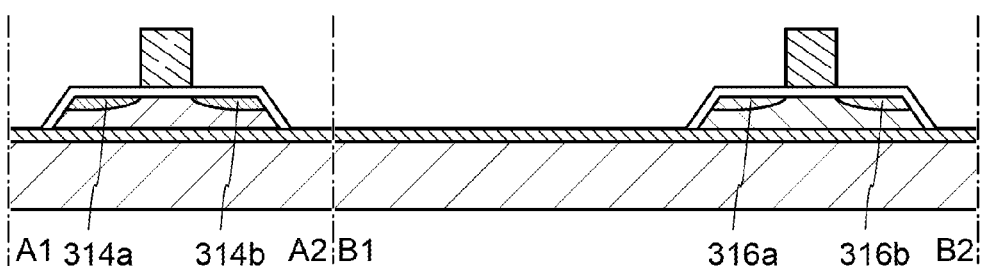

Next, an impurity element imparting n-type conductivity and an impurity element imparting p-type conductivity are added to the semiconductor films 304a and 304b using the gate electrodes 312a and 312b as masks through the gate insulating films 306a and 306b (see FIG. 6E). In this embodiment, phosphorus is added to the semiconductor film 304a through the gate insulating film 306a, so that impurity regions 314a and 314b are formed, and boron is added to the semiconductor film 304b through the gate insulating film 306b, so that impurity regions 316a and 316b are formed.

Figure 7A:
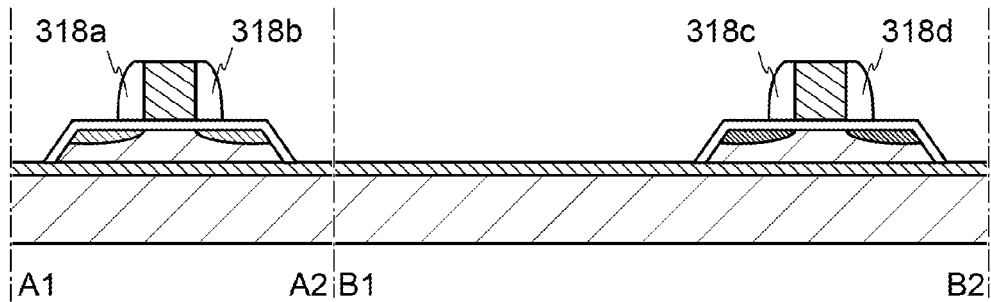
FIGS. 7A to 7D illustrate one example of a manufacturing process of a semiconductor device.

Next, sidewall insulating films 318a to 318d having a sidewall structure are formed on side surfaces of the gate electrodes 312a and 312b (see FIG. 7A). The sidewall insulating films 318a to 318d each may be formed on the side surface of the gate electrode 312a, 312b in a self-aligning manner, by forming an insulating film that covers the gate electrode 312a, 312b, and then processing the insulating film by anisotropic etching by a reactive ion etching (RIE) method. There is no particular limitation on the insulating film; for example, a silicon oxide film with favorable step coverage, which is formed by reacting tetraethyl orthosilicate (TEOS), silane, or the like with oxygen, nitrous oxide, or the like, can be used. A silicon oxide film formed by a low temperature oxidation (LTO) method may also be used. The insulating film can be formed by a thermal CVD method, a plasma-enhanced CVD method, an atmospheric pressure CVD method, a bias ECRCVD method, a sputtering method, or the like.

Figure 7B:
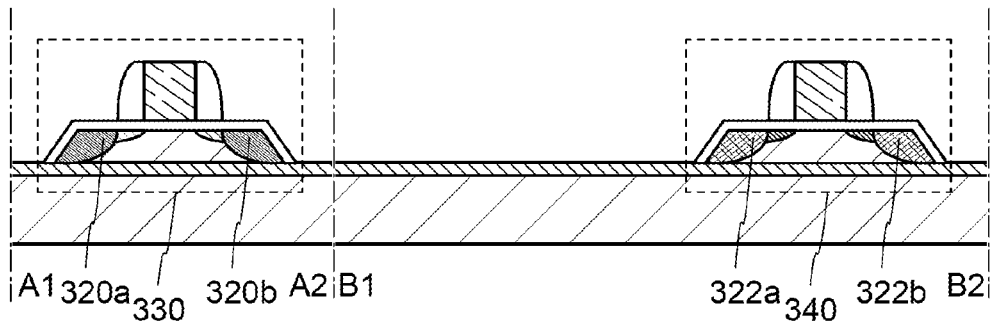

Next, an impurity element imparting n-type conductivity and an impurity element imparting p-type conductivity are added to the semiconductor films 304a and 304b using the gate electrodes 312a and 312b and the sidewall insulating films 318a to 318d as masks through the gate insulating films 306a and 306b (see FIG. 7B). In this embodiment, phosphorus is added to the semiconductor film 304a through the gate insulating film 306a, so that impurity regions 320a and 320b are formed, and boron is added to the semiconductor film 304b through the gate insulating film 306b, so that impurity regions 322a and 322b are formed.

Through the above, the n-channel transistor 330 and the p-channel transistor 340 can be manufactured using the substrate 300 containing a semiconductor material other than an oxide semiconductor (see FIG. 7B). Such transistors are capable of high-speed operation. Therefore, it is preferable to use the transistors as the transistors 103 and 104, or the like because it enables the operation speed of them to be fast.

Figure 7C:
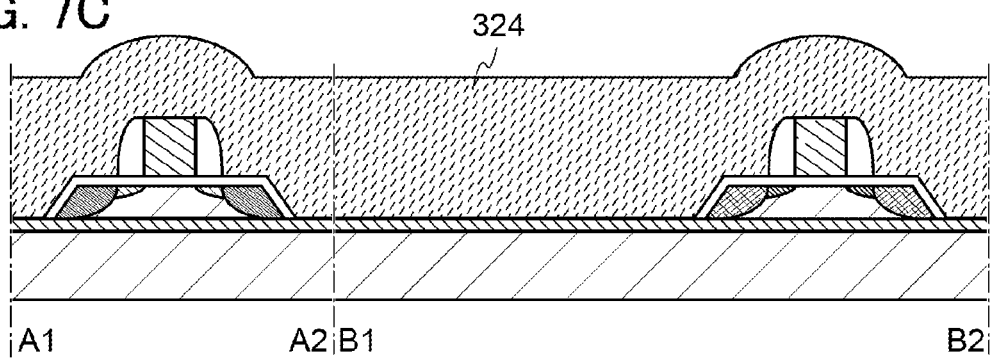

Next, an insulating film 324 is formed so as to cover the transistor 330 and the transistor 340 (see FIG. 7C). The insulating film 324 can be formed using a material containing an inorganic insulating material such as silicon oxide, silicon oxynitride, silicon nitride, or aluminum oxide. A material with a low dielectric constant (low-k material) is preferably used for the insulating film 324 because it enables capacitance attributable to overlap of electrodes or wirings to be sufficiently reduced. A porous insulating film formed using any of the above-described material may also be used as the insulating film 324. The porous insulating film has a lower dielectric constant than an insulating film with high density and thus makes it possible to further reduce capacitance attributable to electrodes or wirings. An organic insulating material such as polyimide or acrylic can also be used to form the insulating film 324. In this embodiment, the case where the insulating film 324 is formed using silicon oxynitride is described.

After the insulating film 324 is formed, next, heat treatment is performed to activate the impurity elements added to the semiconductor films 304a and 304b. The heat treatment is performed using an annealing furnace. Alternatively, a laser annealing method or a rapid thermal annealing (RTA) method can be used. The heat treatment is performed at 400° C. to 600° C., typically 450° C. to 500° C. in a nitrogen atmosphere for 1 to 4 hours. By this heat treatment, in addition to activation of the impurity elements, hydrogen in the silicon oxynitride film of the insulating film 324 is released, so that hydrogenation of the semiconductor films 304a and 304b can be performed.

Before or after any of the above steps, a step of forming an electrode, a wiring, a semiconductor film, an insulating film, or the like may be further performed. For example, an electrode, a wiring, or the like for connecting the transistor in the lower portion and the transistor in the upper portion is preferably formed. In addition, a multilayer wiring structure in which an insulating film and a conductive layer are stacked may be employed as a wiring structure, so that a highly-integrated semiconductor device can be realized.

<Method for Manufacturing Transistor in Upper Portion>

Figure 7D:
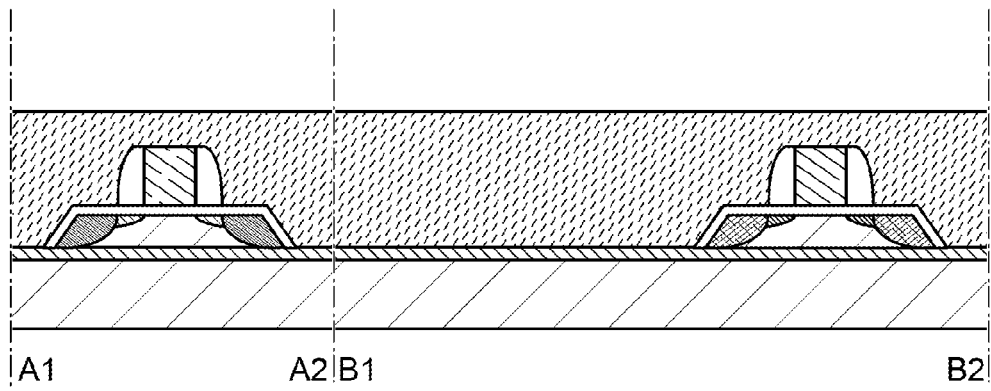

First, as treatment before formation of the transistor 410, a surface of the insulating film 324 is planarized (see FIG. 7D). As the planarization treatment of the insulating film 324, polishing treatment such as chemical mechanical polishing (hereinafter referred to as CMP treatment), etching treatment, plasma treatment, or the like can be used.

Here, the CMP treatment is a treatment of planarizing a surface of an object to be processed by a combination of chemical and mechanical actions. More specifically, the CMP treatment is a method in which a polishing cloth is attached onto a polishing stage, the polishing stage and an object to be processed are each rotated or swung while a slurry (abrasive) is supplied between the object and the polishing cloth, and the surface of the object is polished by a chemical reaction between the slurry and the object and by a mechanical polishing action of the polishing cloth on the object.

As the plasma treatment, a reverse sputtering in which an argon gas is introduced and plasma is produced can be performed. The reverse sputtering is a method in which voltage is applied to a substrate side with use of an RF power source in an argon atmosphere and plasma is generated in the vicinity of the substrate so that the surface is modified. Instead of the argon atmosphere, a nitrogen atmosphere, a helium atmosphere, an oxygen atmosphere, or the like may be used. The reverse sputtering can remove particle substances (also referred to as particles or dust) attached to the surface of the insulating film 324.

As the planarization treatment, polishing treatment, dry etching treatment, or plasma treatment may be performed plural times, or these treatments may be performed in combination. In the case where the treatments are combined, the order of treatments is not particularly limited and may be set as appropriate depending on the roughness of the surface of the insulating film 324.

With the planarization treatment on the insulating film 324, the average surface roughness ($R_a$) of the surface of the insulating film 324 can be reduced to 1 nm or less, preferably 0.3 nm or less, more preferably 0.1 nm or less. Note that $R_a$ is obtained by expanding, into three dimensions, the arithmetic mean surface roughness defined by JIS B 0601: 2001 (ISO4287:1997) so that it can be applied to a curved surface, and can be expressed as an "average value of the absolute values of deviations from a reference surface to a specified surface" and is defined by the following formula.

$$Ra = \frac{1}{S_0} \int_{y_1}^{y_2} \int_{x_1}^{x_2} |f(x, y) - Z_0| \, dx \, dy \qquad \text{[FORMULA 1]}$$

Here, the specified surface is a surface which is a target of roughness measurement, and is a quadrilateral region which is specified by four points at the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. In addition, $S_0$ represents the area of a rectangle which is obtained by projecting the specified surface on the xy plane, and $Z_0$ represents the height of the reference surface (the average height of the specified surface). Further, Ra can be measured using an atomic force microscope (AFM).

Next, a conductive film for forming a gate electrode (including a wiring formed in the same layer as the gate electrode) is formed over the planarized insulating film 324 and processed to form a gate electrode 398. The gate electrode 398 functions as a second gate electrode.

The gate electrode 398 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film of nickel silicide or the like may be used as the gate electrode 398. The gate electrode 398 has either a single-layer structure or a stacked-layer structure.

The gate electrode 398 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible to have a stacked-layer structure of the above-described conductive material and the above-described metal material.

Next, an insulating film 399 is formed over the insulating film 324 and the gate electrode 398. The insulating film 399 can be formed by a plasma-enhanced CVD method or a sputtering method to have a single-layer structure or a stacked-layer structure using an oxide insulating film of silicon oxide, silicon oxynitride, aluminum oxide, aluminum oxynitride, hafnium oxide, or gallium oxide; a nitride insulating film of silicon nitride, silicon nitride oxide, aluminum nitride, or aluminum nitride oxide; or a mixed material of these materials.

The insulating film 399 (in the case of the stacked-layer structure, the film in the stacked-layer structure, that is in contact with an oxide semiconductor film 402 formed later) preferably contains oxygen which exceeds at least the stoichiometric composition in the film (bulk). For example, in the case where a silicon oxide film is used as the insulating film 399, the amount of oxygen is preferably $SiO_{2+\alpha}$ (where $\alpha>0$). By introducing oxygen into the insulating film 399 after the formation of the insulating film 399, the insulating film 399 containing much oxygen can be formed.

As the method of introducing oxygen, an ion implantation method, an ion doping method, a plasma immersion ion implantation method, plasma treatment, or the like can be used.

In an oxide semiconductor film, oxygen vacancy may be formed in the film formation or in the following heat treatment and processing. The oxygen vacancy formed in the oxide semiconductor film leads to formation of majority carriers, causing a problem of a shift in the threshold voltage of the transistor in the negative direction. Therefore, a treatment for decreasing the oxygen vacancy is preferably performed on the oxide semiconductor film.

For example, the insulating film 399 containing much (excess) oxygen, which serves as an oxygen supply source, may be provided so as to be in contact with the oxide semiconductor film 402 formed later, whereby oxygen is supplied from the insulating film 399 to the oxide semiconductor film 402. Heat treatment may be performed in the state where the oxide semiconductor film 402 and the insulating film 399 are at least partly in contact with each other to supply oxygen into the oxide semiconductor film 402. By using the insulating film 399 containing much oxygen, oxygen can be supplied to the oxide semiconductor film 402, so that oxygen vacancies in the oxide semiconductor film 402 can be reduced. Accordingly, formation of majority carriers can be suppressed.

In this embodiment, a 300-nm-thick silicon oxide film is formed by a sputtering method as the insulating film 399.

To improve the planarity of the surface of the oxide semiconductor film 402 formed later, planarization treatment is preferably performed on a region of the insulating film 399, which is in contact with the oxide semiconductor film 402. The planarization treatment can be performed in the similar manner to the planarization treatment performed on the insulating film 324. With the planarization treatment performed on the insulating film 399, the average surface roughness ($R_a$) of the surface of the insulating film 399 is reduced to preferably 1 nm or less, more preferably 0.3 nm or less, still more preferably 0.1 nm or less.

Figure 8A:
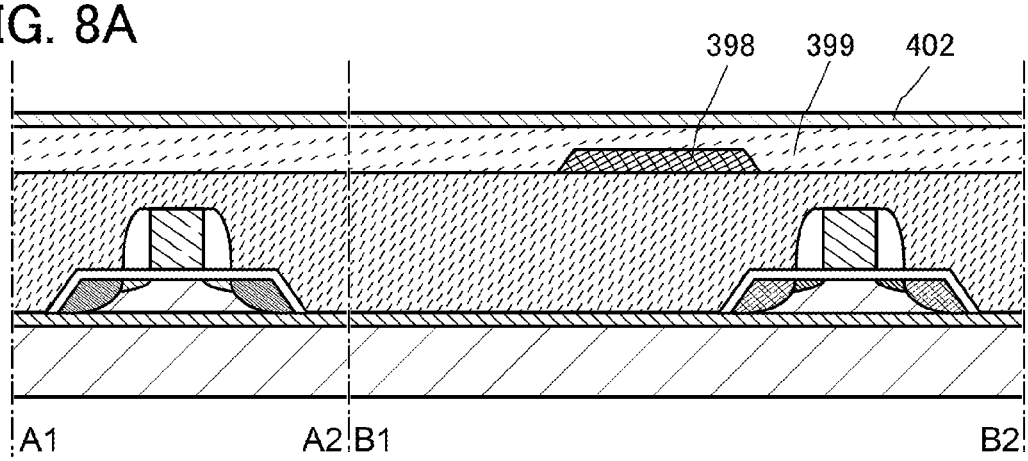
FIGS. 8A to 8C illustrate one example of a manufacturing process of a semiconductor device.
Figure 8B:
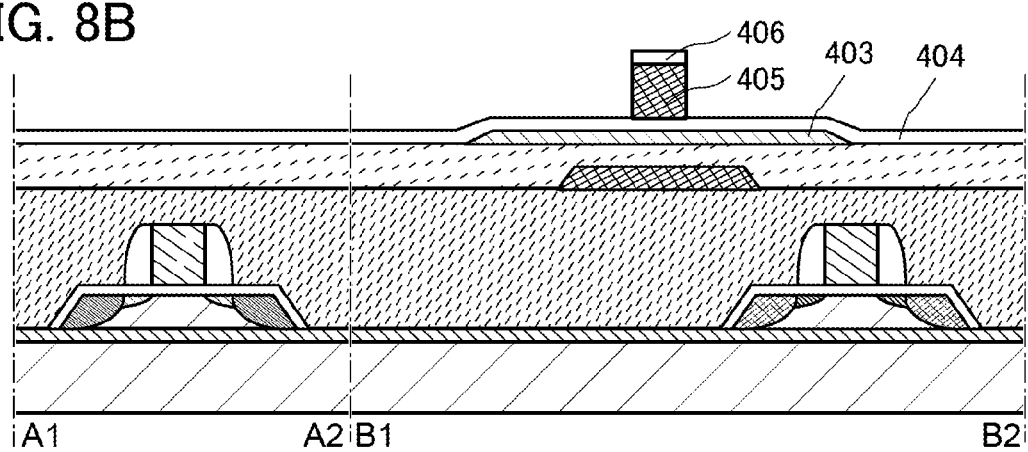
Figure 8C:
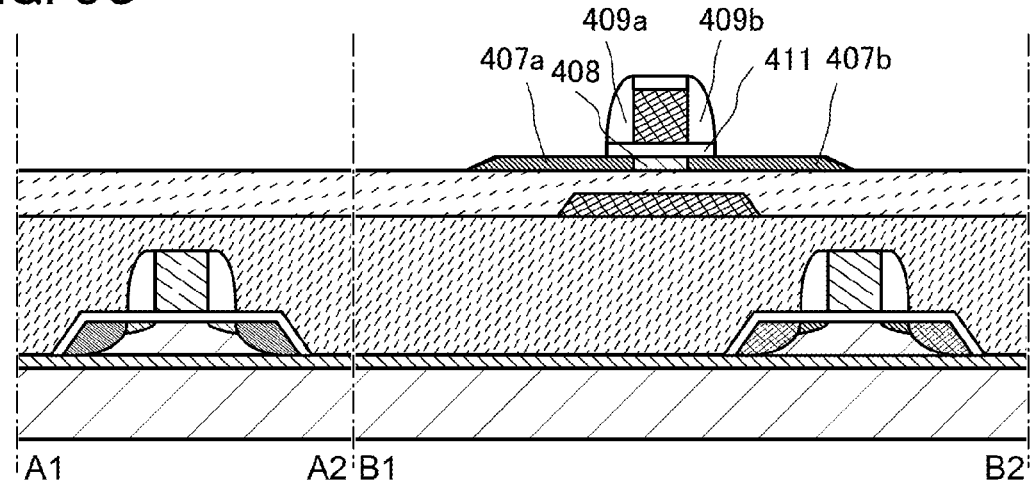

Next, the oxide semiconductor film 402 is formed over the insulating film 399 (see FIG. 8A).

An oxide semiconductor used for the oxide semiconductor film 402 contains at least indium (In). In particular, indium (In) and zinc (Zn) are preferably contained. In addition, as a stabilizer for reducing the variation in electric characteristics of the transistor using the oxide semiconductor, the oxide semiconductor preferably contains gallium (Ga) in addition to In and Zn. Further, it is preferable that one or plural kinds selected from tin (Sn), hafnium (Hf), aluminum (Al), and zirconium (Zr) be contained as a stabilizer.

Further, as another stabilizer, one or plural kinds of lanthanoid consisting of lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four—component metal oxide such as an In—Sn—Ga—Zn-based oxide, an In—Hf—Ga—Zn-based oxide, an In—Al—

Ga—Zn-based oxide, an In—Sn—Al—Zn-based oxide, an In—Sn—Hf—Zn-based oxide, or an In—Hf—Al—Zn-based oxide.

For example, the In—Ga—Zn-based oxide means an oxide containing In, Ga, and Zn as a main component, and there is no limitation on the ratio of In:Ga:Zn. The In—Ga—Zn-based oxide may contain a metal element other than In, Ga, and Zn.

Alternatively, a material represented by $InMO_3(ZnO)_m$ (m>0, m is not an integer) may be used as the oxide semiconductor, where M represents one or more metal elements selected from Ga, Fe, Mn, and Co. Further alternatively, as the oxide semiconductor, a material represented by $In_2SnO_5(ZnO)_n$ (n>0, n is a natural number) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of any of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of any of the above compositions may be used.

However, without limitation to the materials given above, a material with an appropriate composition may be used as the oxide semiconductor containing indium depending on the requirement of semiconductor characteristics (e.g., mobility, threshold voltage, and variation). Further, in order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily with an In—Sn—Zn-based oxide. However, also with an In—Ga—Zn-based oxide, the mobility can be increased by reducing the defect density in the bulk.

In this specification, for example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, where r may be 0.05, for example. The same applies to any other oxide.

The oxide semiconductor film 402 is in a single crystal state, a polycrystalline (also referred to as polycrystal) state, an amorphous state, or the like.

The oxide semiconductor film 402 is preferably a c-axis aligned crystalline oxide semiconductor (CAAC-OS) film.

The CAAC-OS film is neither completely single crystal nor completely amorphous. The CAAC-OS film is an oxide semiconductor film with a crystal-amorphous mixed phase structure where crystal parts are included in an amorphous phase. In most cases, as for the size of the crystal part, the crystal part fits inside a cube whose one side is less than 100 nm. In an observation image with a transmission electron microscope (TEM), a boundary between an amorphous part and a crystal part in the CAAC-OS film is not clear. Further, with the TEM, a grain boundary in the CAAC-OS film is not found. Thus, it can be said that in the CAAC-OS film, a reduction in electron mobility, due to the grain boundary, is suppressed.

In the crystal part included in the CAAC-OS film, a c-axis is aligned in a direction parallel to a normal vector of a surface where the CAAC-OS film is formed or a normal vector of a surface of the CAAC-OS film, triangular or hexagonal atomic arrangement when seen from the direction perpendicular to the a-b plane is formed, and metal atoms are arranged in a layered manner or metal atoms and oxygen atoms are arranged in a layered manner when seen from the direction perpendicular to the c-axis. On the other hand, the directions of the a-axis and the b-axis of the crystal part may be different among the crystal parts. In this specification, a simple term "perpendicular" includes a range from 85° to 95°. In addition, a simple term "parallel" includes a range from −5° to 5°.

In the CAAC-OS film, distribution of the crystal parts is not necessarily uniform. For example, in the formation process of the CAAC-OS film, in the case where crystal growth proceeds from a surface side of the oxide semiconductor film, the proportion of crystal parts in the vicinity of the surface of the oxide semiconductor film is higher than that in the vicinity of the surface where the oxide semiconductor film is formed, in some cases. Further, by adding an impurity to the CAAC-OS film, the crystal part in a region to which the impurity is added becomes amorphous in some cases.

Since the c-axes of the crystal parts included in the CAAC-OS film are aligned in the direction parallel to the normal vector of the surface where the CAAC-OS film is formed or the normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of the c-axis of the crystal part is the direction parallel to a normal vector of the surface where the CAAC-OS film is formed or a normal vector of the surface of the CAAC-OS film at the time of completion of deposition of the CAAC-OS film. The crystal part is formed by deposition or by performing treatment for crystallization such as heat treatment after deposition.

With the use of the CAAC-OS film in a transistor, change in its electric characteristics due to irradiation with visible light or ultraviolet light is small. Thus, the transistor in this embodiment can have high reliability.

Part of constituent oxygen in the oxide semiconductor film may be substituted with nitrogen.

Further, in an oxide semiconductor having a crystal part such as the CAAC-OS, defects in the bulk can be further reduced and mobility higher than that of an oxide semiconductor in an amorphous state can be obtained when the surface flatness of the oxide semiconductor is improved. To improve the surface flatness, the oxide semiconductor is preferably formed over a flat surface. Specifically, the oxide semiconductor is preferably formed over a surface with an average surface roughness (Ra) of less than or equal to 1 nm, more preferably less than or equal to 0.3 nm, still more preferably less than or equal to 0.1 nm.

The oxide semiconductor film 402 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a plasma-enhanced CVD method, a pulse laser deposition method, an atomic layer deposition (ALD) method, or the like as appropriate. The oxide semiconductor film 402 may be formed with a sputtering apparatus which performs film formation with surfaces of a plurality of substrates set substantially perpendicular to a surface of a sputtering target.

Further, the concentration of hydrogen or water in the oxide semiconductor film 402 is preferably as low as possible. This is because if the concentration of hydrogen is high, by a bond of hydrogen and an element contained in the oxide semiconductor, part of hydrogen serves as a donor and generates electrons as carriers.

Therefore, in order that hydrogen or water is not contained in the oxide semiconductor film 402 as much as possible in the step for forming the oxide semiconductor film 402, it is preferable to heat the substrate provided with the insulating film 399 in a preheating chamber in a sputtering apparatus as a pretreatment for formation of the oxide semiconductor film 402 so that impurities such as hydrogen and moisture adsorbed to the substrate and the insulating film 399 are eliminated and evacuated. As an exhaustion unit provided in the preheating chamber, a cryopump is preferable.

The oxide semiconductor film 402 is preferably deposited under a condition such that much oxygen is contained (for example, by a sputtering method in an atmosphere where the proportion of oxygen is 100%) so as to be a film containing much oxygen (preferably containing a region where the content of oxygen is excessive as compared to the stoichiometric composition ratio of the oxide semiconductor in a crystalline state).

In this embodiment, as the oxide semiconductor film 402, a 10-nm-thick In—Ga—Zn-based oxide film (IGZO film) is formed by a sputtering method with a sputtering apparatus including a DC power device. In this embodiment, an In—Ga—Zn-based oxide target with an atomic ratio of In:Ga:Zn=3:1:2 is used.

It is preferable that a high-purity gas from which an impurity such as hydrogen, water, a hydroxyl group, and hydride is removed be used as a sputtering gas for the formation of the oxide semiconductor film 402.

The substrate is held in a deposition chamber kept under reduced pressure. Then, moisture remaining in the deposition chamber is removed, a sputtering gas from which hydrogen and moisture are removed is introduced therein, and the above-described target is used, so that the oxide semiconductor film 402 is formed over the insulating film 399. To remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. From the deposition chamber which is evacuated with a cryopump, a hydrogen atom, a compound containing a hydrogen atom, such as water ($H_2O$), (preferably also a compound containing a carbon atom), and the like are removed, so that the concentration of an impurity such as hydrogen, water, a hydroxyl group, or hydride in the oxide semiconductor film 402 formed in the deposition chamber can be reduced.

Further, it is preferable to form the insulating film 399 and the oxide semiconductor film 402 continuously without exposure of the insulating film 399 to the air. The continuous formation of the insulating film 399 and the oxide semiconductor film 402 without exposure of the insulating film 399 to the air enables impurities such as hydrogen and moisture to be prevented from being adsorbed onto a surface of the insulating film 399.

Next, in a photolithography process, a resist mask is formed over the oxide semiconductor film and selective etching is performed thereon, so that an island-shaped oxide semiconductor film 403 is formed. After the island-shaped oxide semiconductor film 403 is formed, the resist mask is removed.

A resist mask used for forming the island-shaped oxide semiconductor film 403 may be formed by an inkjet method. Formation of the resist mask by an inkjet method needs no photomask; thus, manufacturing cost can be reduced.

The etching of the oxide semiconductor film 402 may be wet etching, dry etching, or both of them. As an etchant used for wet etching of the oxide semiconductor film 402, for example, a solution obtained by mixture of phosphoric acid, acetic acid, and nitric acid, or the like can be used. Further, ITO-07N (produced by KANTO CHEMICAL CO., INC.) may be used. Further, the oxide semiconductor film may also be etched by dry etching using an inductively coupled plasma (ICP) etching method.

Further, heat treatment may be performed on the oxide semiconductor film 403 in order to remove excess hydrogen (including water or a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like.

Further, in the case where a crystalline oxide semiconductor film is used as the oxide semiconductor film 403, heat treatment for crystallization may be performed thereon.

In this embodiment, the substrate is put into an electric furnace that is one of heat treatment apparatuses, and the oxide semiconductor film 403 is subjected to heat treatment at 450° C. in a nitrogen atmosphere for one hour and further to heat treatment at 450° C. in an atmosphere containing nitrogen and oxygen for one hour.

The heat treatment apparatus is not limited to an electric furnace; any device for heating an object by heat conduction or heat radiation from a heating element such as a resistance heating element may be used. For example, a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the high-temperature gas, an inert gas which does not react with an object to be processed by heat treatment, such as nitrogen or a rare gas such as argon, is used.

For example, as the heat treatment, GRTA may be performed as follows: the substrate is put in an inert gas heated at a high temperature of 650° C. to 700° C., heated for several minutes, and taken out of the inert gas.

In the heat treatment, it is preferable that moisture, hydrogen, and the like be not contained in nitrogen or the rare gas such as helium, neon, or argon. The purity of nitrogen or the rare gas such as helium, neon, or argon which is introduced into the heat treatment apparatus is set to preferably 6N (99.9999%) or higher, more preferably 7N (99.99999%) or higher (that is, the impurity concentration is preferably 1 ppm or lower, more preferably 0.1 ppm or lower).

In addition, after the oxide semiconductor film 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb according to the measurement with a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, more preferably 7N or higher (i.e., the impurity concentration in the oxygen gas or the dinitrogen monoxide gas is preferably 1 ppm or less, more preferably 0.1 ppm or less). The oxygen gas or the dinitrogen monoxide gas acts to supply oxygen that is a main constituent material of the oxide semiconductor and which is reduced by the step for removing impurities for dehydration or dehydrogenation, so that oxygen vacancies in the oxide semiconductor film 403 can be reduced.

The timing of the heat treatment for dehydration or dehydrogenation may be either after the formation of the oxide semiconductor film 402 or after the formation of the island-shaped oxide semiconductor film 403.

The heat treatment for dehydration or dehydrogenation may be performed plural times and may also serve as another heat treatment.

When the heat treatment for dehydration or dehydrogenation is performed in the state where the insulating film 399 is covered with the film-shaped oxide semiconductor film 402 which has not been processed into the island-shaped oxide semiconductor film 403, oxygen contained in the insulating film 399 can be prevented from being released to the outside by the heat treatment.

Further, after the heat treatment for dehydration or dehydrogenation, a step for introducing oxygen into the oxide semiconductor film may be performed. By introducing oxygen into the oxide semiconductor film, oxygen released from the oxide semiconductor film by the heat treatment can be repaired, whereby oxygen vacancies in the oxide semiconductor film can be reduced.

As for the step for oxygen introduction, oxygen is introduced into the oxide semiconductor film 403 either directly or through another film such as a gate insulating film. In the case where oxygen is introduced thereinto through another film, an ion implantation method, an ion doping method, a plasma immersion ion implantation method, or the like may be used. In the case where oxygen is introduced directly into the oxide semiconductor film which is exposed, plasma treatment or the like can be used.

Next, an insulating film 404 which is to be a gate insulating film is formed over the insulating film 399 and the oxide semiconductor film 403.

To improve the coverage with the insulating film 404, planarizing treatment may be performed on a surface of the oxide semiconductor film 403. The planarity of the surface of the oxide semiconductor film 403 is preferably good particularly in the case where a thin insulating film is used as the insulating film 404.

The insulating film 404 has a thickness greater than or equal to 1 nm and less than or equal to 20 nm and can be formed by a sputtering method, an MBE method, a plasma-enhanced CVD method, a pulse laser deposition method, an ALD method, or the like as appropriate. The insulating film 404 may also be formed with a sputtering apparatus which performs film deposition with surfaces of a plurality of substrates set substantially perpendicular to a surface of a sputtering target.

The insulating film 404 can be formed using silicon oxide, gallium oxide, aluminum oxide, silicon nitride, silicon oxynitride, aluminum oxynitride, or silicon nitride oxide. With the use of a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide as a material for the insulating film 404, the gate leakage current can be reduced. The insulating film 404 can be formed of a single-layer structure or a stacked-layered structure using any of the above-described materials.

In this embodiment, a 20-nm-thick silicon oxynitride film is formed by a plasma-enhanced CVD method.

Next, a conductive film which is to be a gate electrode (including a wiring formed of the same layer as the gate electrode) is formed over the insulating film 404, and then, an insulating film is formed thereover. After that, in a photolithography process, a resist mask is formed over the insulating film and selective etching is performed thereon, so that a stack of a gate electrode 405 and an insulating film 406 is formed (see FIG. 8B).

The gate electrode 405 can be formed using a metal material such as molybdenum, titanium, tantalum, tungsten, aluminum, copper, chromium, neodymium, or scandium or an alloy material which contains any of these materials as a main component. Alternatively, a semiconductor film typified by a polycrystalline silicon film doped with an impurity element such as phosphorus, or a silicide film of nickel silicide or the like may be used as the gate electrode 405. The gate electrode 405 is formed of either a single-layer structure or a stacked-layer structure.

As a material for the gate electrode 405, a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added can also be used. It is also possible to use a stacked-layer structure of the above-described conductive material and the above-described metal material.

As the gate electrode 405 which is in contact with the insulating film 404, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV (electron volts), preferably higher than or equal to 5.5 eV (electron volts); thus, when used as the gate electrode, the threshold voltage of the electric characteristics of the transistor can be positive. Accordingly, a so-called normally-off switching element can be achieved.

As the insulating film 406, an inorganic insulating material such as silicon oxide, silicon oxynitride, aluminum oxide, aluminum oxynitride, silicon nitride, aluminum nitride, silicon nitride oxide, or aluminum nitride oxide can be used. The insulating film 406 can be formed by a plasma-enhanced CVD method, a sputtering method, or the like.

Next, a dopant is added into the oxide semiconductor film 403 through the insulating film 404 with the gate electrode 405 and the insulating film 406 as masks, so that regions 407a and 407b each of which contains the dopant are formed.

An element by which the conductivity of the oxide semiconductor film 403 is changed is used as the dopant. One or more selected from the following can be used as the dopant: Group 15 elements (e.g., nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

The dopant can be added into the oxide semiconductor film 403 through another film (in this embodiment, the insulating film 404) depending on its addition method. Examples of the method for adding the dopant are an ion implantation method, an ion doping method, and a plasma immersion ion implantation method. In that case, it is preferable to use a single ion of the dopant, a fluoride ion, or a chloride ion.

The introduction of the dopant may be controlled by setting the implantation conditions such as the accelerated voltage and the dosage, or the thickness of the films through which the dopant passes, as appropriate. In this embodiment, phosphorus is used as the dopant, and phosphorus ions are implanted by an ion implantation method. The dosage of the dopant can be set to be greater than or equal to $1\times10^{13}$ ions/cm$^2$ and less than or equal to $5\times10^{16}$ ions/cm$^2$.

By adding the dopant to the oxide semiconductor film 403, the concentration of the dopant in the region 407a, 407b which contains the dopant is preferably greater than or equal to $5\times10^{18}$/cm$^3$ and less than or equal to $1\times10^{22}$/cm$^3$.

The dopant may be added to the oxide semiconductor film 403 while the substrate is heated. Further, the introduction of the dopant into the oxide semiconductor film 403 may be performed plural times, and plural kinds of dopants may be used.

Further, heat treatment may be performed thereon after the dopant is added. The heat treatment is preferably performed at a temperature higher than or equal to 300° C. and lower than or equal to 700° C., more preferably higher than or equal to 300° C. and lower than or equal to 450° C. for one hour under an oxygen atmosphere. The heat treatment may also be performed under a nitrogen atmosphere, reduced pressure, or the air (ultra-dry air).

In this embodiment, phosphorus (P) ions are implanted into the oxide semiconductor film 403 by an ion implantation method. The conditions of the phosphorus (P) ion implantation are as follows: the acceleration voltage is 25 kV and the dosage is $1.0\times10^{15}$ ions/cm$^2$.

In the case where the oxide semiconductor film 403 is a CAAC-OS film, the oxide semiconductor film 403 is partly amorphized by the addition of the dopant in some cases. In that case, the crystallinity of the oxide semiconductor film 403 can be recovered by performing heat treatment thereon after the introduction of the dopant.

As a result of the introduction of the dopant, the oxide semiconductor film 403 in which the regions 407a and 407b containing the dopant between which a channel formation region 408 is interposed is formed.

Next, an insulating film is formed over the gate electrode 405 and the insulating film 406, and the insulating film is etched, whereby sidewall insulating films 409a and 409b are formed. Further, the insulating film 404 is etched with the gate electrode 405 and the sidewall insulating films 409a and 409b as masks, so that a gate insulating film 411 is formed (see FIG. 8C).

The sidewall insulating films 409a and 409b can be formed using a material and a method similar to those of the insulating film 406. In this embodiment, a silicon oxynitride film formed by a CVD method is used for the sidewall insulating films 409a and 409b.

Next, a conductive film which is to be a source electrode and a drain electrode (including a wiring formed of the same layer as the source electrode and the drain electrode) is formed to cover the oxide semiconductor film 403, the gate insulating film 411, the sidewall insulating films 409a and 409b, and the insulating film 406.

The conductive film which is to be the source electrode and the drain electrode can be formed, for example, using a metal film containing an element selected from aluminum (Al), chromium (Cr), copper (Cu), tantalum (Ta), titanium (Ti), molybdenum (Mo), and tungsten (W), a metal nitride film (a titanium nitride film, a molybdenum nitride film, or a tungsten nitride film) containing any of the above elements as a component, or the like. A high-melting-point metal film of titanium, molybdenum, tungsten, or the like or a metal nitride film of any of these elements (e.g., a titanium nitride film, a molybdenum nitride film, or a tungsten nitride film) may be stacked on at least one of a lower side and an upper side of the metal film of aluminum, copper, or the like.

A conductive metal oxide film may also be used as the conductive film which is to be the source and drain electrodes. As the conductive metal oxide, indium oxide (In$_2$O$_3$), tin oxide (SnO$_2$), zinc oxide (ZnO), indium oxide-tin oxide (In$_2$O$_3$—SnO$_2$; abbreviated to ITO), indium oxide-zinc oxide (In$_2$O$_3$—ZnO), or any of these metal oxide materials to which silicon oxide is added can be used. It is possible to use a stacked-layer structure of the above-described conductive material and the above-described metal oxide material.

Next, in a photolithography process, a resist mask is formed over the conductive film, and selective etching is performed on the conductive film, whereby the source electrode and the drain electrode are processed in the direction of the channel width W.

Next, over the conductive film, an insulating film 415 and an insulating film 417 are formed.

The insulating film 415 and the insulating film 417 are formed as appropriate by a method such as a sputtering method, which prevents entry of impurities such as hydrogen.

As each of the insulating film 415 and the insulating film 417, an inorganic insulating film, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film can be used.

As the insulating film 415, an inorganic insulating film having a high density may be provided in contact with a source electrode 416a and a drain electrode 416b.

For example, an aluminum oxide film is formed over the source electrode 416a and the drain electrode 416b by a sputtering method. When the aluminum oxide film has a high density (the film density is higher than or equal to 3.2 g/cm$^3$, preferably higher than or equal to 3.6 g/cm$^3$), the transistor 410 can have stable electric characteristics. The film density can be measured by Rutherford backscattering spectrometry (RBS) or X-ray reflection (XRR).

An aluminum oxide film which can be used as an inorganic insulating film provided over the transistor 410 has a high shielding effect (blocking effect) of preventing penetration of both oxygen and impurities such as hydrogen and moisture.

Therefore, in and after the manufacturing process of the transistor, the aluminum oxide film functions as a protective film for preventing entry of an impurity such as hydrogen or moisture, which causes a change in the electric characteristics of the transistor, into the oxide semiconductor film 403 and release of oxygen, which is a main constituent material of the oxide semiconductor, from the oxide semiconductor film 403.

Next, polishing treatment is performed on the insulating film 415, the insulating film 417, and the conductive film to expose the insulating film 406. Accordingly, the insulating film 415, the insulating film 417, and the conductive film are partly removed, so that the source electrode 416a and the drain electrode 416b are formed.

As the polishing treatment, a chemical mechanical polishing (CMP) method can be used, but another cutting (grinding or polishing) method may be alternatively used.

Further, the planarity of the polished surface can be improved by performing a dry etching method, plasma treatment (reverse plasma treatment), or the like after the polishing treatment.

In this embodiment, since the insulating film 406 is provided over the gate electrode 405, even when the polishing treatment is performed on the insulating film 415, the insulating film 417, and the conductive film, a short circuit between the gate electrode 405 and any of the source electrode 416a and the drain electrode 416b can be suppressed.

Figure 9A:
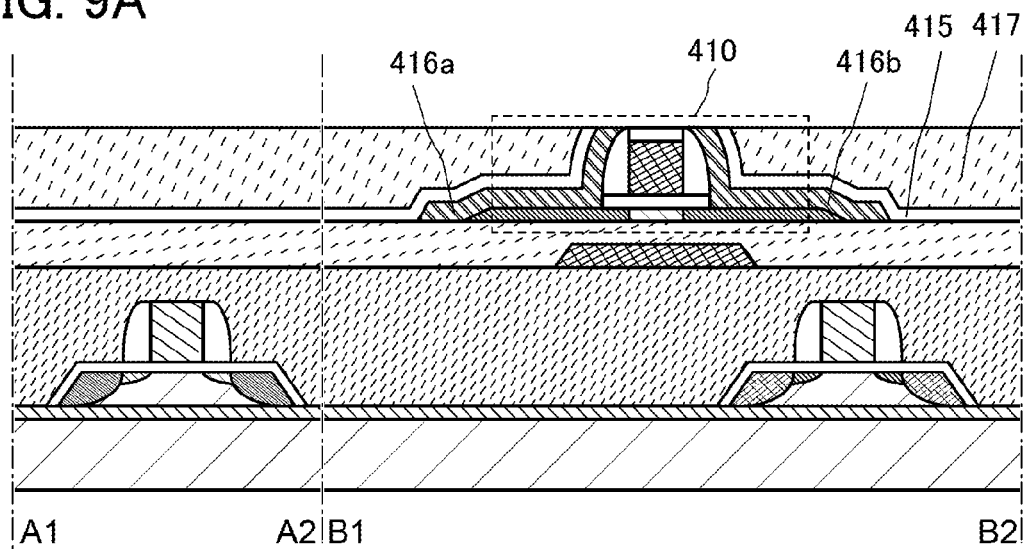
FIGS. 9A and 9B illustrate one example of a manufacturing process of a semiconductor device.
Figure 9B:
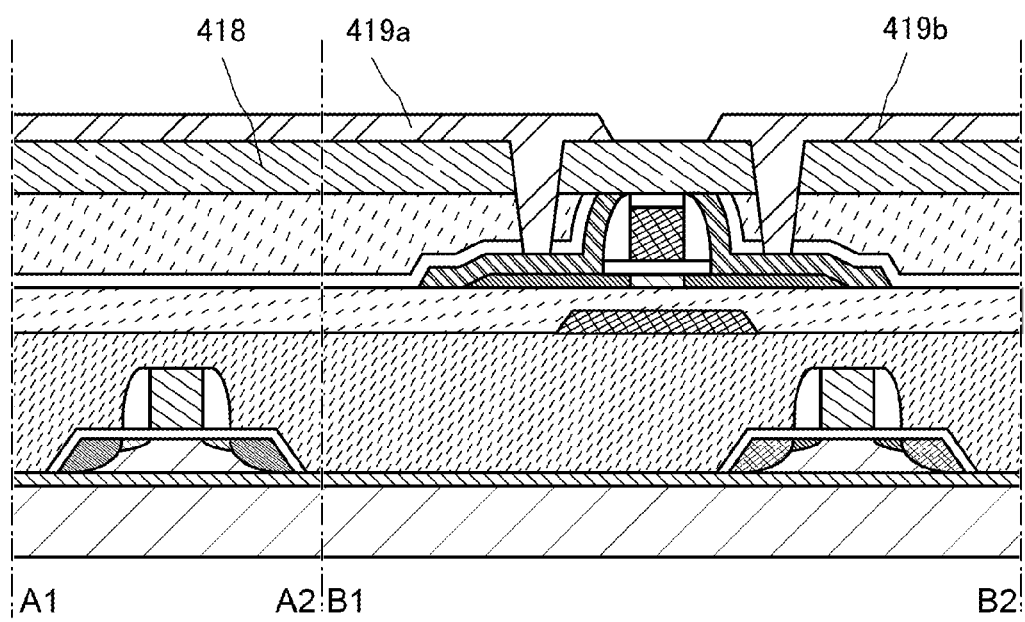

Through the above process, the transistor 410 according to one embodiment of the present invention is formed (see FIG. 9A).

Next, an insulating film 418 is formed to cover the transistor 410. The insulating film 418 can be formed using a material and a method which are the same as those of any of the insulating films 415 and 417, and thus description thereof is skipped.

Next, over the insulating film 418, wirings 419a and 419b for connecting the transistor 410 to another transistor are formed. The wiring 419a is electrically connected to the source electrode 416a through an opening formed in the insulating film 415, the insulating film 417, and the insulating film 418. The wiring 419b is electrically connected to the drain electrode 416b through an opening formed in the insulating film 418, the insulating film 415, and the insulating film 417.

The wiring 419a, 419b can be formed using a similar material and a similar method to the gate electrode 405, and thus detailed description thereof is skipped.

For example, as the wiring 419a, 419b, a single layer of a molybdenum film, a stacked layer of a tantalum nitride film and a copper film, a stacked layer of a tantalum nitride film and a tungsten film, or the like can be used.

Through the above-described process, the level-shift circuit according to one embodiment of the present invention can be formed.

In accordance with the manufacturing method described in this embodiment, the transistor using a semiconductor film of an oxide semiconductor or the like can be formed to be stacked over the transistor using a single crystalline semiconductor film of silicon or the like. Accordingly, the transistors constituting the level-shift circuit can partly have a stack structure, leading to a reduction in the area of the level-shift circuit.

Further, in accordance with the manufacturing method described in this embodiment, impurities such as hydrogen in the oxide semiconductor film are sufficiently reduced, or sufficient oxygen is supplied to make the oxide semiconductor film an oxygen-excess state, whereby high purification can be achieved. Specifically, the concentration of hydrogen in the oxide semiconductor film is $5\times10^{19}$ atoms/cm$^3$ or less, preferably $5\times10^{18}$ atoms/cm$^3$ or less, more preferably $5\times10^{17}$ atoms/cm$^3$ or less. The concentration of hydrogen in the oxide semiconductor film is measured by secondary ion mass spectrometry (SIMS). Further, by sufficiently supplying oxygen into the oxide semiconductor film to reduce oxygen vacancies, an increase in majority carriers is suppressed. Accordingly, a change of the threshold voltage of the transistor due to an increase in majority carriers can be suppressed, so that the reliability of the transistor can be improved.

Accordingly, majority carriers (electrons) of the oxide semiconductor film 403 flow only from the source of the transistor. Further, the channel formation region can be depleted completely, enabling an off-state current of the transistor to be extremely small. The off-state current of the transistor using the oxide semiconductor film 403 is extremely small: 10 yA/μm or less at room temperature, and 1 zA/μm or less at 85° C. to 95° C.

Accordingly, the S factor of the transistor using the oxide semiconductor film 403 is reduced to be an ideal value. Further, the transistor has high reliability.

Accordingly, the threshold voltage of the transistor 410 described in this embodiment can be easily controlled by the potential applied to the second gate electrode. With the use of the transistor 410 in the level-shift circuit, the amplitude of a signal output from the level-shift circuit can be easily controlled.

Although the transistors which constitute the level-shift circuit are described in this embodiment, the manufacturing method described in this embodiment allows any other circuit in a semiconductor integrated circuit to be manufactured, as well as the level-shift circuit. For example, using the extremely small off-state current of the transistor 410 using the upper oxide semiconductor film 403 as described above, a nonvolatile memory cell array can be formed. Details of the nonvolatile memory cell array are described in Embodiment 3. A reduction in the size of a semiconductor integrated circuit can be achieved by forming such a memory cell array and a transistor included in a level-shift circuit in its upper portion and forming a peripheral circuit for driving the memory circuit and an inverter circuit included in the level-shift circuit in its lower portion.

The structures, methods, and the like described in this embodiment can be combined as appropriate with any structure, any method, and the like described in the other embodiments.

(Embodiment 3)

In this embodiment, a storage device which uses the transistor described in Embodiment 2, can retain stored data even in a period during which power is not supplied, and does not have a limitation on the number of write cycles is described with reference to FIGS. 10A and 10B and FIGS. 11A and 11B.

The storage device described in this embodiment can be fabricated at the same time as formation of the transistors constituting the level-shift circuit described in Embodiment 2.

Figure 10A:
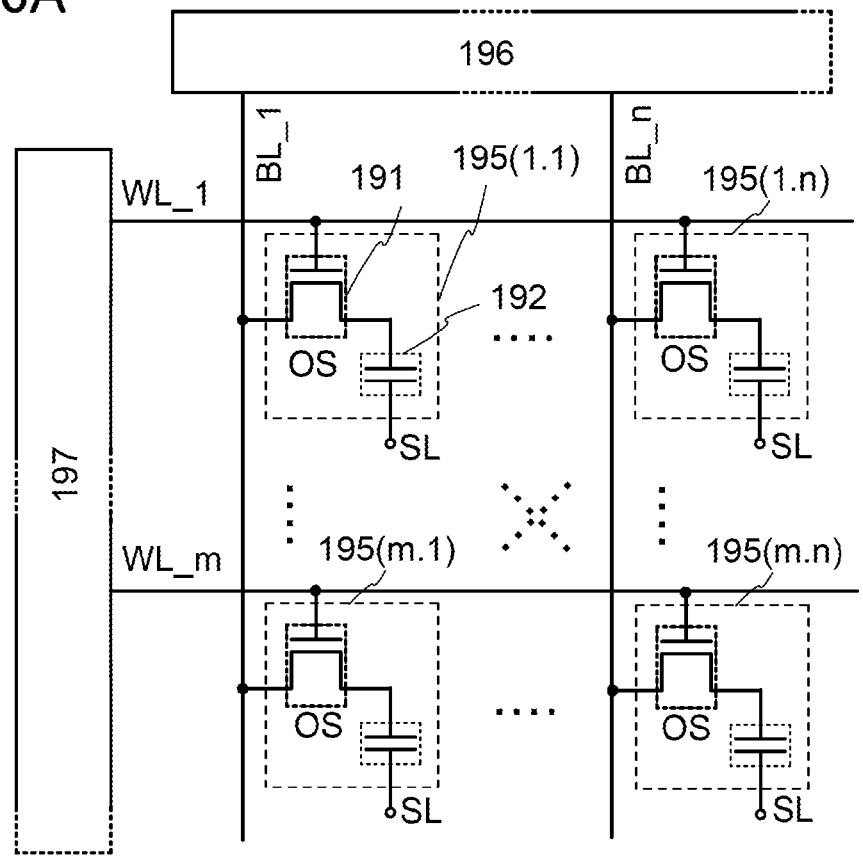
FIGS. 10A and 10B are a circuit diagram and a perspective view illustrating one embodiment of a semiconductor device.
Figure 10B:
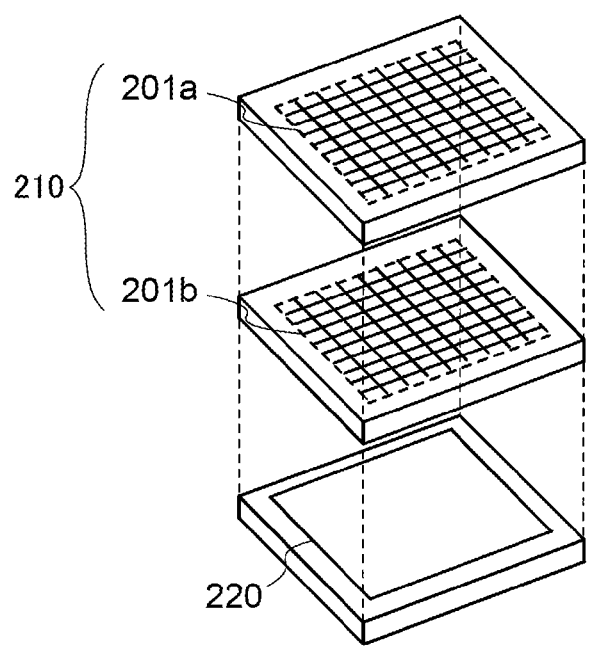

FIG. 10A illustrates one example of a circuit configuration of a storage device, and FIG. 10B is a conceptual diagram illustrating one example of the storage device. First, the device illustrated in FIG. 10A is described, and then, the semiconductor device illustrated in FIG. 10B is described.

The storage devices illustrated in FIGS. 10A and 10B each include n bit lines BL, m word lines WL, a memory cell array having memory cells 195 arranged in a matrix of m (rows) (in the vertical direction)×n (columns) (in the horizontal direction), a first driver circuit 196 connected to the n bit lines BL, and a second driver circuit 197 connected to the m word lines WL.

The memory cell 195 includes a transistor 191 and a capacitor 192. The bit line BL is electrically connected to a source electrode or a drain electrode of the transistor 191, the word line WL is electrically connected to a gate electrode of the transistor 191, and the source electrode or the drain electrode of the transistor 191 is electrically connected to a first terminal of the capacitor 192.

Next, writing and retaining of data in the semiconductor device (memory cell 195) illustrated in FIG. 10A are described.

First, the potential of the word line WL is set to a potential at which the transistor 191 is turned on, so that the transistor 191 is turned on. Accordingly, the potential of the bit line BL is supplied to the first terminal of the capacitor 192 (writing). After that, the potential of the word line WL is set to a potential at which the transistor 191 is turned off, so that the transistor 191 is turned off. Thus, the potential at the first terminal of the capacitor 192 is retained (retaining).

The transistor 191 which uses an oxide semiconductor has a feature of an extremely small off-state current. Therefore, the potential at the first terminal of the capacitor 192 (or charge accumulated in the capacitor 192) can be retained for an extremely long time by turning off the transistor 191.

Next, reading of data is described. The transistor 191 is turned on, so that the bit line BL which is in a floating state is electrically connected to the capacitor 192, and the charge is redistributed between the bit line BL and the capacitor 192. As a result, the potential of the bit line BL is changed. The amount of change in potential of the bit line BL varies depending on the potential at the first terminal of the capacitor 192 (or the charge accumulated in the capacitor 192).

For example, the potential of the bit line BL after charge redistribution is (CB×VB0+C×V)/(CB+C), where V is the potential at the first terminal of the capacitor 192, C is the capacitance of the capacitor 192, CB is the capacitance of the bit line BL (hereinafter also referred to as bit line capacitance), and VB0 is the potential of the bit line BL before the charge redistribution. Thus, it can be found that, assuming that the memory cell 195 has either of two states in which respective potentials at the first terminal of the capacitor 192 are V1 and V0 (V1>V0), the potential of the bit line BL in the case of retaining the potential V1 (=(CB×VB0+C×V1)/(CB+C)) is higher than the potential of the bit line BL in the case of retaining the potential V0 (=(CB×VB0+C×V0)/(CB+C)).

Then, the potential of the bit line BL is compared with a predetermined potential. In this manner, data can be read.

As described above, the semiconductor device illustrated in FIG. 10A can retain charge accumulated in the capacitor 192 for a long time, taking advantage of the extremely small off-state current of the transistor 191. That is, refresh operation becomes unnecessary or the frequency of refresh operation can be reduced to be extremely low, thereby sufficiently reducing power consumption. Further, stored data can be retained for a long time even in a period during which power is not supplied.

Next, the semiconductor device illustrated in FIG. 10B is described.

The semiconductor device illustrated in FIG. 10B includes memory cell arrays 201a and 201b each including the plurality of memory cells 195 illustrated in FIG. 10A as a memory circuit in its upper portion, and a peripheral circuit 220 for driving the memory cell array 210 (memory cell arrays 201a and 201b) in its lower portion. The peripheral circuit 220 is electrically connected to each of the memory cell array 201a and the memory cell array 201b.

With the structure illustrated in FIG. 10B, the peripheral circuit 220 can be provided directly under the memory cell array 210 (the memory cell arrays 201a and 201b), whereby the size of the semiconductor device can be decreased.

It is preferable that a semiconductor material for a transistor provided in the peripheral circuit 220 be different from that for the transistor 191. For example, silicon, germanium, silicon germanium, silicon carbide, gallium arsenide, or the like can be used; a single crystal semiconductor is preferably used. Alternatively, an organic semiconductor material or the like may be used. A transistor using such a semiconductor material can operate at sufficiently high speed. Therefore, a variety of circuits (e.g., a logic circuit or a driver circuit) which needs to operate at high speed can be favorably realized with the transistor. As for the transistor provided in the peripheral circuit 220, refer to the description of the transistor 330 and the transistor 340 in Embodiment 2.

FIG. 10B illustrates, as an example, the semiconductor device in which two memory cell arrays 210 (the memory cell array 201a and the memory cell array 201b) are stacked; however, the number of memory cell arrays to be stacked is not limited thereto. Three or more memory cell arrays may be stacked.

Next, a specific structure of the memory cell 195 shown in FIG. 10A is described with reference to FIGS. 11A and 11B.

Figure 11A:
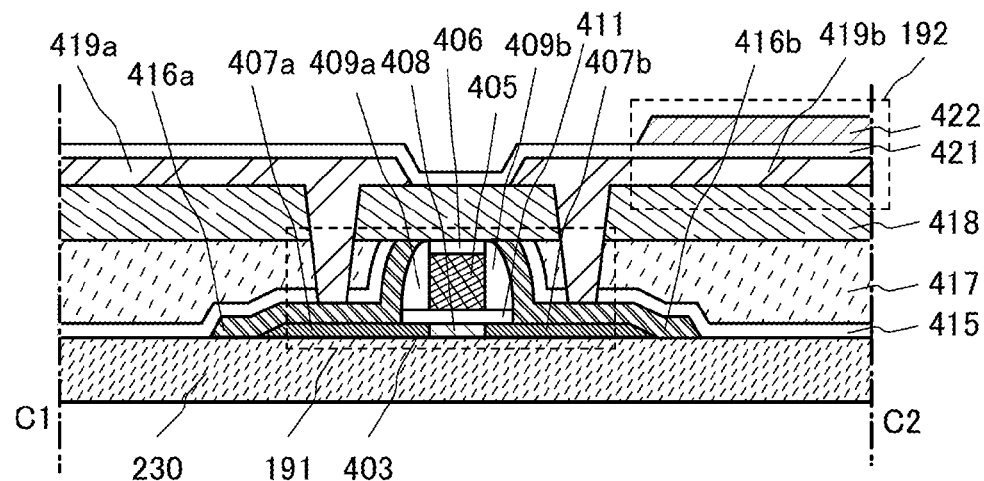
FIGS. 11A and 11B are a cross-sectional view and a plan view illustrating one embodiment of a semiconductor device.
Figure 11B:
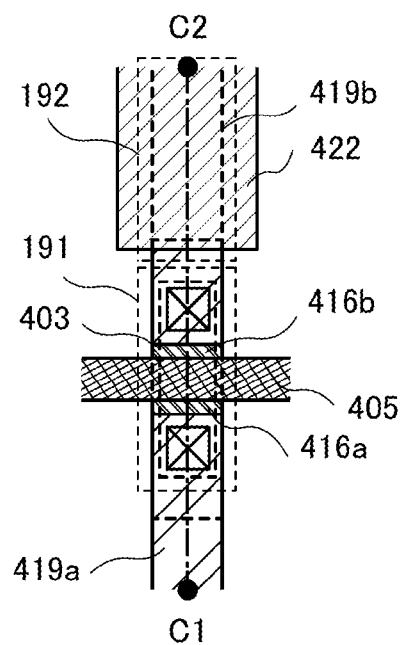

FIGS. 11A and 11B illustrate one example of structure of the memory cell 195. FIG. 11A is a cross-sectional view of the memory cell 195, and FIG. 11B is a plan view of the memory cell 195. FIG. 11A corresponds to a cross section taken along line C1-C2 in FIG. 11B.

The transistor 191 illustrated in FIGS. 11A and 11B can have the same structure as the transistor 410 described in Embodiment 2; thus, the detailed description thereof is skipped.

Further, the capacitor 192 is formed by forming an electrode 422 over an insulating film 421. As for a material and a method of the electrode 422, refer to the description of the wiring 419a, 419b.

The capacitor 192 in the memory cell 195 illustrated in FIGS. 11A and 11B can be formed only by forming the insulating film 421 and the electrode 422 after the formation of the wiring 419a, 419b for the transistor 410 described in Embodiment 2. Therefore, it is not necessary to separately form the transistor 410 for the level-shift circuit and the transistor for the memory cell.

In the case where the memory cell array has a stacked-layer structure, an insulating film may be further formed over the insulating film 421 and the electrode layer 422, and a transistor using an oxide semiconductor similar to the transistor 191 may be formed over the insulating film.

Further, by adopting the planar layout illustrated in FIG. 11B, the area occupied by the semiconductor device can be reduced; thus, the degree of integration can be increased.

As described above, the plurality of memory cells formed in multiple layers each include a transistor using an oxide semiconductor. Since the off-state current of the transistor using an oxide semiconductor is small, the transistor enables stored data to be retained for a long time. That is, the frequency of refresh operation can be extremely lowered, which leads to a sufficient reduction in power consumption.

In this manner, a semiconductor device having both a peripheral circuit using a transistor using a material other than an oxide semiconductor (in other words, a transistor capable of operating at sufficiently high speed) and a storage device using a transistor using an oxide semiconductor (in a broader sense, a transistor whose off-state current is sufficiently small) can be achieved.

Further, the memory cell array and the transistor included in the level-shift circuit are formed in the upper portion, and the peripheral circuit for driving the memory cell array and the inverter circuit included in the level-shift circuit are formed in the lower portion, whereby the size of the semiconductor integrated circuit can be decreased.

This embodiment can be implemented in appropriate combination with any structure described in the other embodiments.

(Embodiment 4)

In this embodiment, examples of application of a semiconductor integrated circuit using the level-shift circuit and the memory circuit described in any of the above-described embodiments to portable devices such as mobile phones, smartphones, or e-book readers are described with reference to FIGS. 12 and 13.

Figure 12:
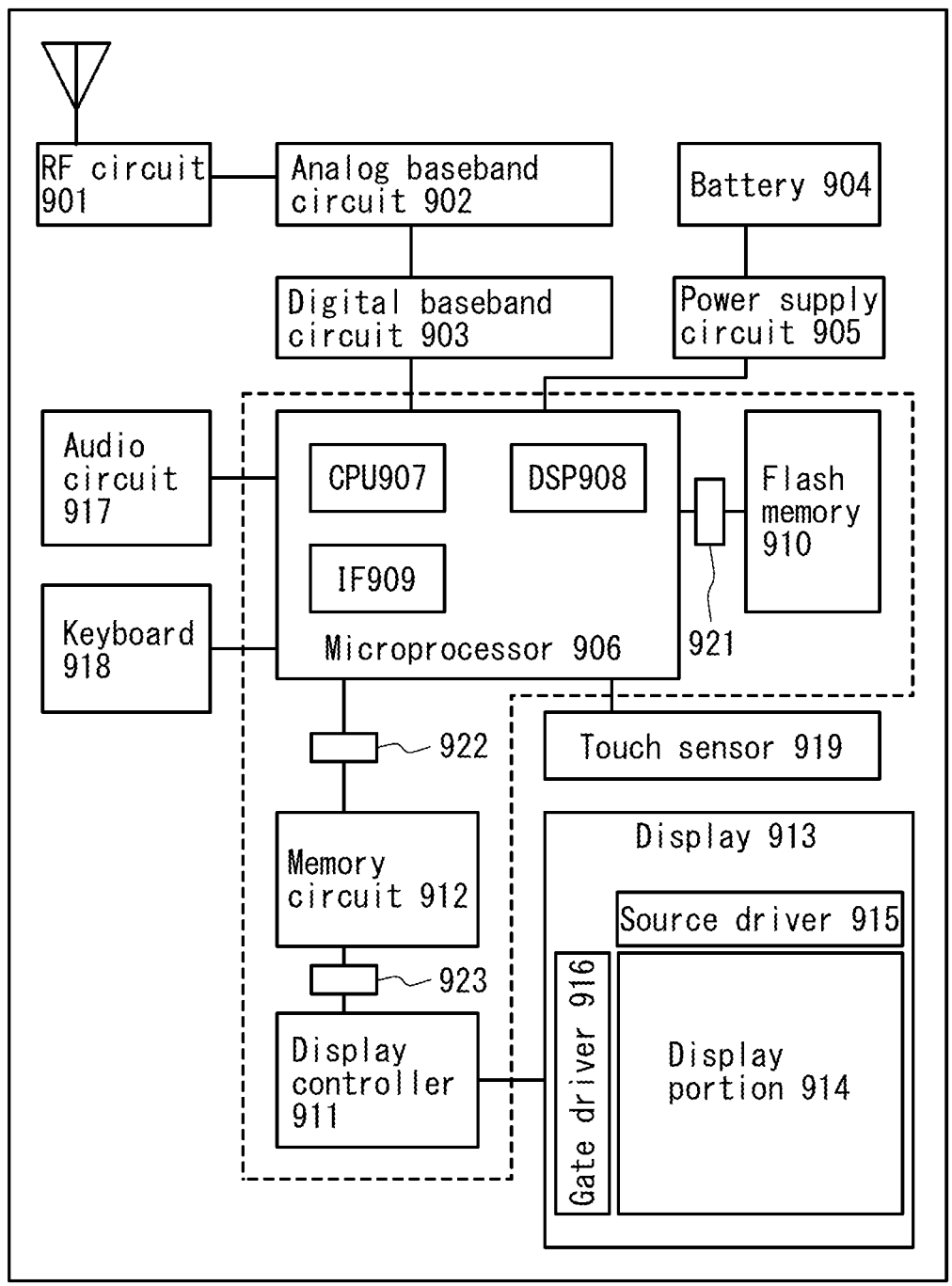
FIG. 12 is a block diagram illustrating one embodiment of a semiconductor device.

FIG. 12 is a block diagram of a portable device. The portable device illustrated in FIG. 12 includes an RF circuit 901, an analog baseband circuit 902, a digital baseband circuit 903, a battery 904, a power supply circuit 905, a microprocessor 906, a flash memory 910, a display controller 911, a memory circuit 912, a display 913, a touch sensor 919, an audio circuit 917, and a keyboard 918. The display 913 includes a display portion 914, a source driver 915, and a gate driver 916. The microprocessor 906 includes a CPU 907, a DSP 908, and an interface 909 (IF 909). The microprocessor 906, the flash memory 910, the memory circuit 912, and the display controller 911 can be incorporated in one chip (see a dotted line in FIG. 12).

The microprocessor 906 is connected to the flash memory 910 through a level-shift circuit 921. The microprocessor 906 is also connected to the memory circuit 912 through a level-shift circuit 922. The memory circuit 912 is also connected to the display controller 911 through a level-shift circuit 923. Any of the level-shift circuits shown in FIGS. 1A to 1C and FIGS. 2 to 5 can be applied to the level-shift circuit 921, 922, 923. For example, in the case where the level-shift circuit illustrated in FIG. 2 or 3 is applied, not all the level-shift circuits 921 to 923 are necessarily provided. The level-shift circuit can have a stacked-layer structure, whereby the area of the level-shift circuit can be reduced. Accordingly, the size of the semiconductor integrated circuit can be reduced. Further, it is possible to set the minimum voltage for driving the flash memory 910, the memory circuit 912, and the display controller 911 as appropriate, thereby reducing power consumption of the semiconductor integrated circuit.

Further, by employing the storage device described in any of the above-described embodiments for the memory circuit 912, data can be written and read at high speed and can be retained for a long time, and power consumption can be sufficiently reduced. Further, like the level-shift circuit, a stacked-layer structure can be used, whereby the circuit area of the memory circuit 912 can be reduced. Accordingly, the size of the semiconductor integrated circuit can be reduced.

Figure 13:
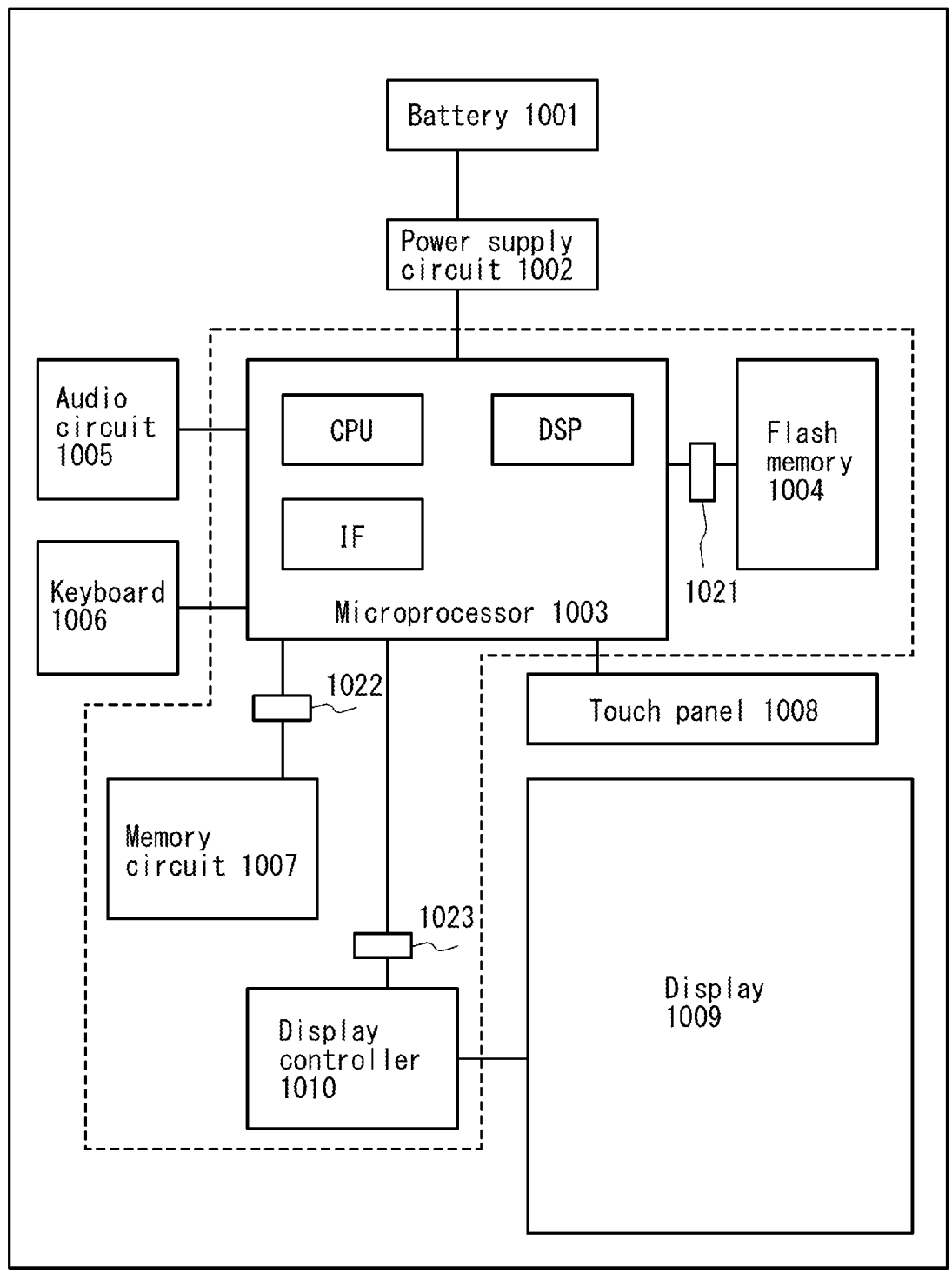
FIG. 13 is a block diagram illustrating one embodiment of a semiconductor device.

FIG. 13 is a block diagram of an e-book reader. The e-book reader in FIG. 13 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010. The microprocessor 1003, the flash memory 1004, the memory circuit 1007, and the display controller 1010 can be incorporated in one chip (see a dotted line in FIG. 13).

The microprocessor 1003 is connected to the flash memory 1004 through a level-shift circuit 1021. The microprocessor 1003 is also connected to the memory circuit 1007 through a level-shift circuit 1022. The microprocessor 1003 is also connected to the display controller 1010 through a level-shift circuit 1023. Any of the level-shift circuits shown in FIGS. 1A to 1C and FIGS. 2 to 5 can be applied to the level-shift circuit 1021, 1022, 1023. For example, in the case where the level-shift circuit illustrated in FIG. 2 or 3 is applied, not all the level-shift circuits 1021 to 1023 are necessarily provided. The level-shift circuit can have a stacked-layer structure, whereby the area of the level-shift circuit can be reduced. Accordingly, the size of the semiconductor integrated circuit can be reduced. Further, it is possible to set the minimum voltage for driving the flash memory 1004, the memory circuit 1007, and the display controller 1010 as appropriate, thereby reducing power consumption of the semiconductor integrated circuit.

Further, by employing the storage device described in any of the above-described embodiments for the memory circuit 1007, data can be written and read at high speed and can be retained for a long time, and power consumption can be sufficiently reduced. Further, like the level-shift circuit, a stacked-layer structure can be used, whereby the circuit area of the memory circuit 1007 can be reduced. Accordingly, the size of the semiconductor integrated circuit can be reduced.

The structures, methods, and the like described in this embodiment can be combined as appropriate with any structure, any method, and the like described in the other embodiments.

(Embodiment 5)

A semiconductor device according to one embodiment of the present invention can be applied to a variety of electronic devices (including game machines). Examples of the electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of the electronic devices each having the semiconductor device described in the above-described embodiment are described.

Figure 14A:
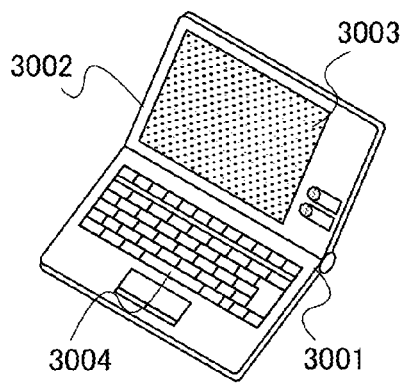
FIGS. 14A to 14F illustrate electronic devices.

FIG. 14A illustrates a laptop personal computer, which includes a main body 3001, a housing 3002, a display portion 3003, and a keyboard 3004. Further, the semiconductor integrated circuit according to the above-described embodiment can be applied to a semiconductor integrated circuit inside the main body, though not shown. Application of the semiconductor integrated circuit according to the above-described embodiment enables the laptop personal computer to be downsized.

Figure 14B:
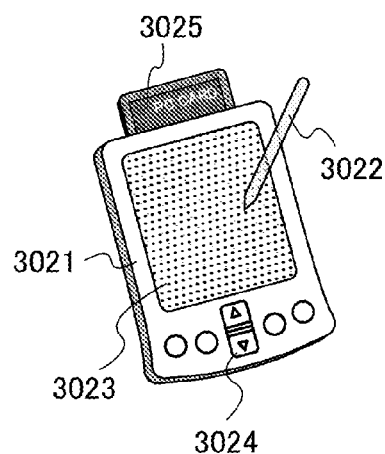

FIG. 14B is a personal digital assistant (PDA), which includes a main body 3021 provided with a display portion 3023, an external interface 3025, and operation buttons 3024. A stylus 3022 is included as an accessory for operation. Further, the semiconductor integrated circuit according to the above-described embodiment can be applied to a semiconductor integrated circuit inside the main body, though not shown. Application of the semiconductor integrated circuit according to the above-described embodiment enables the personal digital assistant (PDA) to be downsized.

Figure 14C:
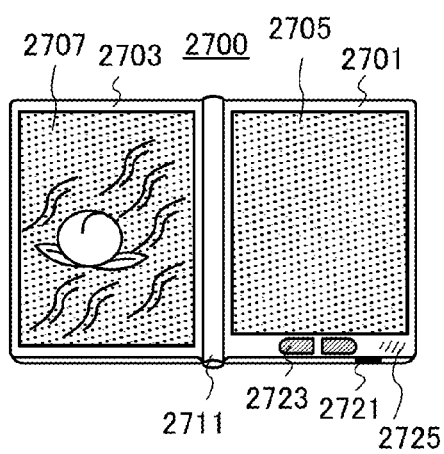

FIG. 14C illustrate one example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 display either a one-screen image or different-screen images. In the structure where different-screen images are displayed, for example, the right display portion (the display portion 2705 in FIG. 14C) displays text and the left display portion (the display portion 2707 in FIG. 14C) displays images. Further, the semiconductor integrated circuit according to the above-described embodiment can be applied to a semiconductor integrated circuit inside the main body, though not shown. Application of the semiconductor integrated circuit according to the above-described embodiment enables the e-book reader 2700 to be downsized.

FIG. 14C illustrates an example in which the housing 2701 is provided with an operation portion and the like. For example, the housing 2701 is provided with a power switch 2721, operation keys 2723, a speaker 2725, and the like. With the operation key 2723, pages can be turned. Note that a keyboard, a pointing device, or the like may also be provided on the surface of the housing, on which the display portion is provided. Further, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

Further, the e-book reader 2700 may be configured to be capable of wirelessly transmitting and receiving data. Through wireless communication, desired book data or the like can be purchased and downloaded from an electronic book server.

Figure 14D:
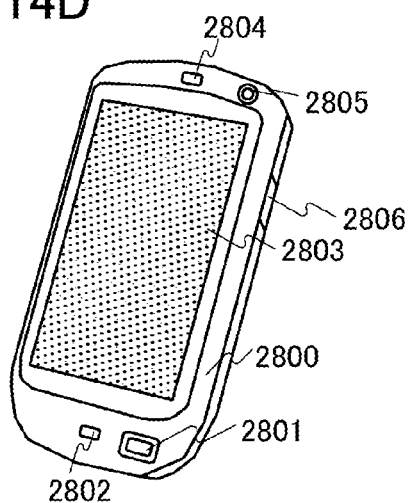

FIG. 14D illustrates a smartphone which includes a housing 2800, a button 2801, a microphone 2802, a display portion 2803 provided with a touch panel, a speaker 2804, and a camera lens 2805 and has a function of a mobile phone. Further, the semiconductor integrated circuit according to the above-described embodiment can be applied to a semiconductor integrated circuit inside its main body, though not shown. Application of the semiconductor integrated circuit according to the above-described embodiment enables the smartphone to be downsized.

The display direction of the display portion 2803 can be changed depending on a usage pattern. Since the camera lens 2805 is provided on the same plane as the display portion 2803, videophone is possible. The speaker 2804 and the microphone 2802 enable operations such as video calls, sound recording, and playback without being limited to the voice call function.

Further, an external connection terminal 2806 can be connected to an AC adapter and various types of cables such as a USB cable, and enables charging and data communication with a personal computer or the like. Furthermore, a large amount of data can be stored and moved by a storage medium inserted into an external memory slot (not shown).

Further, in addition to the above functions, an infrared communication function, a television reception function, or the like may be provided.

Figure 14E:
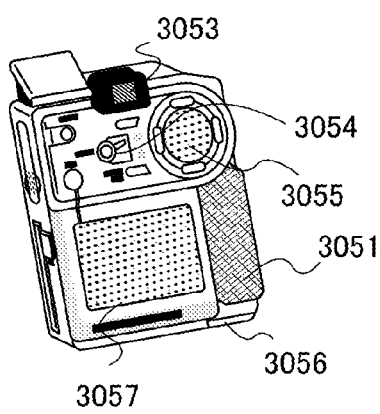

FIG. 14E illustrates a digital video camera which includes a main body 3051, a display portion A 3057, an eyepiece portion 3053, an operation switch 3054, a display portion B 3055, and a battery 3056. Further, the semiconductor integrated circuit according to the above-described embodiment can be applied to a semiconductor integrated circuit inside the main body, though not shown. Application of the semiconductor integrated circuit according to the above-described embodiment enables the digital video camera to be downsized.

Figure 14F:
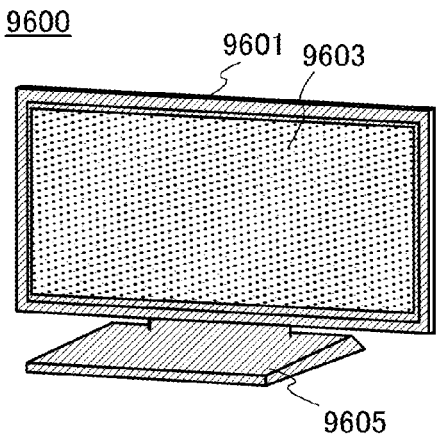

FIG. 14F illustrates one example of a television set. In the television set 9600, a display portion 9603 is incorporated in a bezel 9601. The display portion 9603 can display images. Here, the bezel 9601 is supported by a stand 9605. Further, the semiconductor integrated circuit according to the above-described embodiment can be applied to a semiconductor integrated circuit inside its main body, though not shown. Application of the semiconductor integrated circuit according to the above-described embodiment enables the television set 9600 to be downsized.

The television set 9600 can be operated by an operation switch of the bezel 9601 or a separate remote controller. Further, the remote controller may be provided with a display portion for displaying data output from the remote controller.

The television set 9600 is provided with a receiver, a modem, and the like. With the receiver, general television broadcasting can be received. Moreover, with connection to a communication network with or without wires via the modem, one-way (from sender to receiver) or two-way (between sender and receiver or between receivers) data communication can be performed.

The structures, methods, and the like described in this embodiment can be combined as appropriate with any structure, any method, and the like described in the other embodiments.

This application is based on Japanese Patent Application serial no. 2011-282510 filed with Japan Patent Office on Dec. 23, 2011, the entire contents of which are hereby incorporated by reference.

What is claimed is:

1. A level-shift circuit comprising:
   a first transistor comprising:
      a first gate electrode;
      a second gate electrode;
      a source electrode; and
      a channel formation region provided between the first gate electrode and the second gate electrode; and
   an inverter circuit electrically connected to the first transistor, the inverter circuit including an input terminal and an output terminal,
   wherein the first gate electrode and the source electrode are configured to be supplied with a first power source potential,
   wherein the second gate electrode is configured to be supplied with a second power source potential,
   wherein the inverter circuit is configured to be supplied with a third power source potential as a power source potential,
   wherein the input terminal is configured to be supplied with an input signal,
   wherein either the third power source potential or a potential obtained by subtracting an amount of change in a threshold voltage of the first transistor from the first power source potential is supplied to the inverter circuit as a power source voltage,
   wherein an output signal is output from the inverter circuit, and
   wherein the channel formation region of the first transistor is formed in an oxide semiconductor film.

2. The level-shift circuit according to claim 1,
   wherein the inverter circuit comprises a p-channel second transistor and an n-channel third transistor.

3. The level-shift circuit according to claim 2,
   wherein an interlayer insulating film is provided over the second transistor and the third transistor,
   wherein the first transistor is provided over the interlayer insulating film, and
   wherein a channel formation region of each of the second transistor and the third transistor comprises silicon.

4. A semiconductor integrated circuit comprising:
   the level-shift circuit according to claim 1; and
   a memory cell array including a plurality of memory cells each comprising a fourth transistor and a capacitor,
   wherein a channel formation region of the fourth transistor is formed in an oxide semiconductor film.

5. A level-shift circuit comprising:
   a first transistor comprising:
      a first gate electrode;
      a second gate electrode;
      a source electrode; and
      a channel formation region provided between the first gate electrode and the second gate electrode;
   a first inverter circuit electrically connected to the first transistor, the first inverter circuit including an input terminal;
   a first output terminal electrically connected to the first inverter circuit; and a second inverter circuit electrically connected to the first inverter circuit and the first output terminal, the second inverter circuit including a second output terminal, wherein the first gate electrode and the source electrode are configured to be supplied with a first power source potential, wherein the second gate electrode is configured to be supplied with a second power source potential, wherein the first inverter circuit and the second inverter circuit are configured to be supplied with a third power source potential as a power source potential, wherein the input terminal is configured to be supplied with an input signal, wherein either the third power source potential or a potential obtained by subtracting an amount of change in a threshold voltage of the first transistor from the first power source potential is supplied to the first inverter circuit as a power source voltage, wherein a first output signal is output from the first inverter circuit, wherein the first output signal is input to the second inverter circuit, wherein either the third power source potential or the potential obtained by subtracting the amount of change in the threshold voltage of the first transistor from the first power source potential is supplied to the second inverter circuit as a power source voltage, wherein a second output signal is output from the second inverter circuit, and wherein the channel formation region of the first transistor is formed in an oxide semiconductor film.

6. The level-shift circuit according to claim 5, wherein the first inverter circuit comprises a p-channel second transistor and an n-channel third transistor, and wherein the second inverter circuit comprises a p-channel fourth transistor and an n-channel fifth transistor.

7. The level-shift circuit according to claim 6, wherein an interlayer insulating film is provided over the second transistor, the third transistor, the fourth transistor, and the fifth transistor, wherein the first transistor is provided over the interlayer insulating film, and wherein a channel formation region of each of the second transistor, the third transistor, the fourth transistor, and the fifth transistor comprises silicon.

8. A semiconductor integrated circuit comprising:

the level-shift circuit according to claim 5; and a memory cell array including a plurality of memory cells each comprising a sixth transistor and a capacitor, wherein a channel formation region of the sixth transistor is formed in an oxide semiconductor film.

9. A level-shift circuit comprising:

a first transistor comprising:
  a first gate electrode;
  a second gate electrode;
  a source electrode; and
  a channel formation region provided between the first gate electrode and the second gate electrode;

a second transistor comprising:
  a first gate electrode;
  a second gate electrode;
  a source electrode; and
  a channel formation region provided between the first gate electrode and the second gate electrode;

a first inverter circuit electrically connected to the first transistor and the second transistor, the first inverter circuit including an input terminal;

a first output terminal electrically connected to the first inverter circuit; and a second inverter circuit electrically connected to the first inverter circuit and the first output terminal, the second inverter circuit including a second output terminal, wherein the first gate electrode of the first transistor and the source electrode of the first transistor are configured to be supplied with a first power source potential, wherein the second gate electrode of the first transistor is configured to be supplied with a second power source potential, wherein the source electrode of the second transistor is configured to be supplied with a third power source potential, wherein the second gate electrode of the second transistor is configured to be supplied with a fourth power source potential, wherein the input terminal is configured to be supplied with an input signal, wherein either a potential obtained by subtracting an amount of change in a threshold voltage of the first transistor from the first power source potential or a potential obtained by adding an amount of change in a threshold voltage of the second transistor to the third power source potential is supplied to the first inverter circuit as a power source voltage, wherein a first output signal is output from the first inverter circuit, wherein the first output signal is input to the second inverter circuit and either the potential obtained by subtracting the amount of change in the threshold voltage of the first transistor from the first power source potential or the potential obtained by adding the amount of change in the threshold voltage of the second transistor to the third power source potential is supplied to the second inverter circuit as a power source voltage, wherein a second output signal is output from the second inverter circuit, and wherein the channel formation region of each of the first transistor and the second transistor is formed in an oxide semiconductor film.

10. The level-shift circuit according to claim 9, wherein the first inverter circuit comprises a p-channel third transistor and an n-channel fourth transistor, and wherein the second inverter circuit comprises a p-channel fifth transistor and an n-channel sixth transistor.

11. The level-shift circuit according to claim 10, wherein an interlayer insulating film is provided over the third transistor, the fourth transistor, the fifth transistor, and the sixth transistor, wherein the first transistor and the second transistor are provided over the interlayer insulating film, and wherein a channel formation region of each of the third transistor, the fourth transistor, the fifth transistor, and the sixth transistor comprises silicon.

12. A semiconductor integrated circuit comprising:

the level-shift circuit according to claim 9; and a memory cell array including a plurality of memory cells each comprising a seventh transistor and a capacitor, wherein a channel formation region of the seventh transistor is formed in an oxide semiconductor film.

13. A level-shift circuit comprising:

a first transistor comprising:
  a first gate electrode;
  a second gate electrode;
  a source electrode; and a channel formation region provided between the first gate electrode and the second gate electrode;
a second transistor comprising:
a first gate electrode;
a second gate electrode;
a source electrode; and
a channel formation region provided between the first gate electrode and the second gate electrode;
a first inverter circuit electrically connected to the first transistor, the first inverter circuit including a first input terminal and a first output terminal; and
a second inverter circuit electrically connected to the second transistor, the second inverter circuit including a second input terminal and a second output terminal,
wherein the first gate electrode of the first transistor and the source electrode of the first transistor are configured to be supplied with a first power source potential,
wherein the second gate electrode of the first transistor is configured to be supplied with a second power source potential,
wherein the first inverter circuit and the second inverter circuit are configured to be supplied with a third power source potential as a power source potential,
wherein the source electrode of the second transistor and the first gate electrode of the second transistor are configured to be supplied with either the third power source potential or a potential obtained by subtracting an amount of change in a threshold voltage of the first transistor from the first power source potential,
wherein the second gate electrode of the second transistor is configured to be supplied with a fourth power source potential,
wherein the first input terminal and the second input terminal are configured to be supplied with an input signal,
wherein either the third power source potential or the potential obtained by subtracting the amount of change in the threshold voltage of the first transistor from the first power source potential is supplied to the first inverter circuit as a power source voltage,
wherein a first output signal is output from the first inverter circuit,
wherein either the third power source potential or a potential obtained by subtracting the amount of change in the threshold voltage of the first transistor and an amount of change in a threshold voltage of the second transistor from the first power source potential is supplied to the second inverter circuit as a power source voltage,
wherein a second output signal is output from the second inverter circuit, and
wherein the channel formation region of each of the first transistor and the second transistor is formed in an oxide semiconductor film.

14. The level-shift circuit according to claim 13,
wherein the first inverter circuit comprises a p-channel third transistor and an n-channel fourth transistor, and
wherein the second inverter circuit comprises a p-channel fifth transistor and an n-channel sixth transistor.

15. The level-shift circuit according to claim 14,
wherein an interlayer insulating film is provided over the third transistor, the fourth transistor, the fifth transistor, and the sixth transistor,
wherein the first transistor and the second transistor are provided over the interlayer insulating film, and
wherein a channel formation region of each of the third transistor, the fourth transistor, the fifth transistor, and the sixth transistor comprises silicon.

16. A semiconductor integrated circuit comprising:
the level-shift circuit according to claim 13; and
a memory cell array including a plurality of memory cells each comprising a seventh transistor and a capacitor,
wherein a channel formation region of the seventh transistor is formed in an oxide semiconductor film.

17. A level-shift circuit comprising:
a first transistor comprising:
a first gate electrode;
a second gate electrode;
a source electrode;
a drain electrode; and
a channel formation region provided between the first gate electrode and the second gate electrode; and
an inverter circuit, the inverter circuit including a first terminal electrically connected to the drain electrode of the first transistor, a second terminal configured to be supplied with a third power source potential, an input terminal, and an output terminal,
wherein the first gate electrode and the source electrode are configured to be supplied with a first power source potential,
wherein the second gate electrode is configured to be supplied with a second power source potential,
wherein the input terminal is configured to be supplied with a first input signal,
wherein a first output signal is output from the inverter circuit, and
wherein the channel formation region of the first transistor is formed in an oxide semiconductor film.

18. The level-shift circuit according to claim 17,
wherein the inverter circuit comprises a p-channel second transistor and an n-channel third transistor.

19. The level-shift circuit according to claim 18,
wherein an interlayer insulating film is provided over the second transistor and the third transistor,
wherein the first transistor is provided over the interlayer insulating film, and
wherein a channel formation region of each of the second transistor and the third transistor comprises silicon.

20. A semiconductor integrated circuit comprising:
the level-shift circuit according to claim 17; and
a memory cell array including a plurality of memory cells each comprising a fourth transistor and a capacitor,
wherein a channel formation region of the fourth transistor is formed in an oxide semiconductor film.

* * * * *